US005838628A

United States Patent [19]

Cliff et al.

[11] Patent Number: 5,838,628

[45] Date of Patent: Nov. 17, 1998

[54] PROGRAMMABLE LOGIC ARRAY INTEGRATED CIRCUITS

[75] Inventors: Richard G. Cliff, Milpitas; L. Todd Cope, San Jose; Cameron R. Mc Clintock, Mountain View; William Leong, San Francisco; James A. Watson, Santa Clara; Joseph Huang, San Jose; Bahram Ahanin, Cupertino, all of Calif.

[73] Assignee: Altera Corporation, San Jose, Calif.

[21] Appl. No.: 840,534

[22] Filed: Apr. 22, 1997

Related U.S. Application Data

[63] Continuation of Ser. No. 655,870, May 24, 1996, Pat. No. 5,668,771, which is a continuation of Ser. No. 245,509, May 18, 1994, Pat. No. 5,550,782, which is a continuation-in-part of Ser. No. 111,693, Aug. 25, 1993, Pat. No. 5,436,575, which is a continuation-in-part of Ser. No. 754,017, Sep. 3, 1991, Pat. No. 5,260,610, and Ser. No. 880,942, May 8, 1992, Pat. No. 5,260,611.

[51] Int. Cl.[6] .................... G11C 13/00

[52] U.S. Cl. .................... 365/230.03; 365/189.02; 365/230.02

[58] Field of Search .................... 365/189.01, 189.02, 365/189.04, 230.01, 230.02, 230.03

[56] References Cited

U.S. PATENT DOCUMENTS

| | | | |
|---|---|---|---|
| 4,203,159 | 5/1980 | Waulass | 365/222 |
| 4,642,487 | 2/1987 | Carter | 307/465 |
| 4,706,216 | 11/1987 | Carter | 365/94 |
| 4,758,985 | 7/1988 | Carter | 365/94 |
| 4,831,591 | 5/1989 | Imazeki et al. . | |
| 4,870,302 | 9/1989 | Freeman | 307/465 |
| 4,975,601 | 12/1990 | Steele . | |
| 5,089,993 | 2/1992 | Neal et al. | 365/230.08 |
| 5,099,150 | 3/1992 | Steele . | |
| 5,128,559 | 7/1992 | Steele | 307/465 |
| 5,144,582 | 9/1992 | Steele . | |
| 5,258,668 | 11/1993 | Cliff et al. | 307/465 |
| 5,260,610 | 11/1993 | Pedersen et al. | 307/465 |
| 5,260,611 | 11/1993 | Cliff | 307/465 |
| 5,436,575 | 7/1995 | Pedersen et al. | 326/40 |
| 5,550,782 | 8/1996 | Cliff et al. | 365/230.03 |

FOREIGN PATENT DOCUMENTS

WO 95/16993 6/1995 WIPO .

OTHER PUBLICATIONS

"Optimized reconfigurable cell array (ORCA) series field–programmable gate arrays," *AT&T Microelectronics*, pp. 1–87 (Advance Data Sheet, Feb. 1985).

"The Programmable Logic Data Book," Xilnx, Inc., 1994, pp. 2–5 –2–102.

*Primary Examiner*—Terrell W. Fears

*Attorney, Agent, or Firm*—Townsend and Townsend and Crew, LLP

[57] ABSTRACT

A programmable logic array integrated circuit has a number of programmable logic modules which are grouped together in a plurality of logic array blocks ("LABs"). The LABs are arranged on the circuit in a two dimensional array. A conductor network is provided for interconnecting any logic module with any other logic module. In addition, adjacent or nearby logic modules are connectable to one another for such special purposes as providing a carry chain between logic modules and/or for connecting two or more modules together to provide more complex logic functions without having to make use of the general interconnection network. Another network of so-called fast or universal conductors is provided for distributing widely used logic signals such as clock and clear signals throughout the circuit. Multiplexers can be used in various ways to reduce the number of programmable interconnections required between signal conductors.

15 Claims, 27 Drawing Sheets

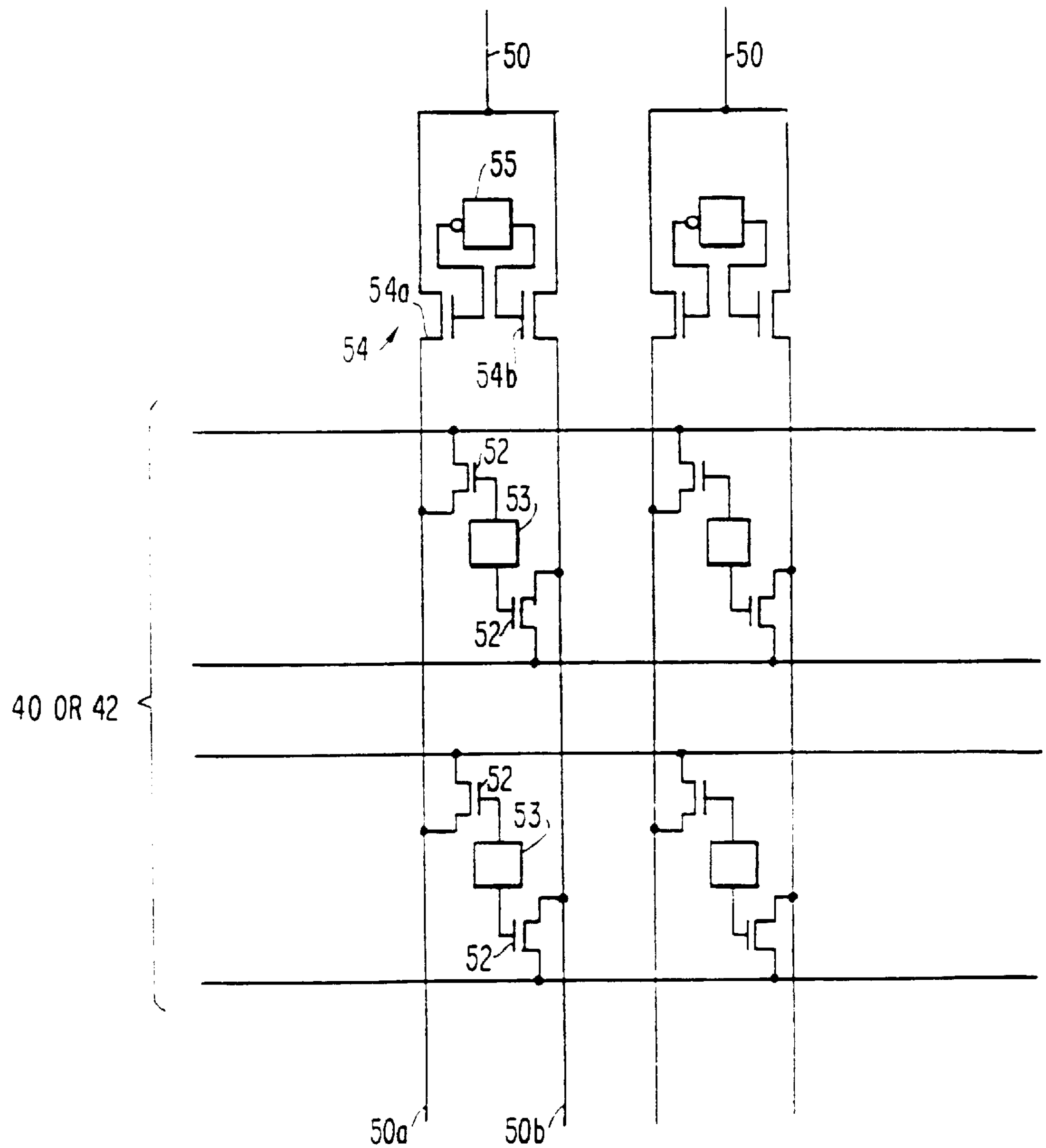
F I G. 8

PROGRAMMABLE LOGIC ELEMENT
PROGRAMMABLE LOGIC ELEMENT
PROGRAMMABLE LOGIC ELEMENT
20
40 OR 42
47
43
45
49
50
52

PROGRAMMABLE LOGIC ARRAY INTEGRATED CIRCUITS

This patent application is a continuation of Ser. No. 08/655,870 filed May 24, 1996, now U.S. Pat. No. 5,668,771, which is a continuation of Ser. No. 08/245,509, filed May 18, 1998, now U.S. Pat. No. 5,550,782, which is a continuation-in-part of Ser. No. 08/111,693, filed Aug. 25, 1993, now U.S. Pat. No. 5,436,575, which is a continuation-in-part of Ser. No. 07/754,017, filed Sep. 3, 1991 now U.S. Pat. No. 5,260,610, and Ser. No. 07/880,942, filed May 8, 1992 now U.S. Pat. No. 5,260,611.

BACKGROUND OF THE INVENTION

This invention relates to programmable logic array integrated circuits, and more particularly to programmable logic array integrated circuits with improved arrangements of the programmable logic elements and improved interconnections between those elements.

Programmable logic arrays are known in which substantial numbers of relatively elementary individual programmable logic elements are provided in a two-dimensional array. The array also includes a grid of intersecting signal conductors for conducting logic signals to, from, and between the programmable logic elements. Such programmable logic arrays are shown, for example, in Carter U.S. Pat. Nos. 4,642,487, 4,706,216, and 4,758,985, and in Freeman U.S. Pat. No. 4,870,302.

As integrated circuit fabrication techniques progress, it becomes possible to put more and more programmable logic elements on a chip. As the number of elements increases, it becomes important to improve the techniques used to interconnect them. For example, it is important to provide enough interconnection pathways between the programmable logic elements so that the capabilities of those elements can be fully utilized and so that complex logic functions (requiring concatenation of programmable logic elements) can be performed, without providing so many such pathways that there is a wasteful excess of this type of resource. Similarly, as the number of programmable elements increases, the complexity of the logic which can be performed also increases. But this in turn tends to increase the complexity of the task of programming the circuit unless additional logical structure is included in the circuit to help correspondingly structure the programming task.

There is always room for further improvement, however, and there are some situations in which the provision of additional or alternative types of interconnections between the logic modules would have benefits sufficient to justify the additional circuit and programming complexity. Such additional interconnection paths may be desirable for making frequently needed kinds of interconnections, for speeding certain kinds of interconnections, for allowing short distance connections to be made without tying up more general purpose and therefore long distance interconnection resources, etc. There is also a continuing demand for logic devices with larger capacity. This produces a need to implement logic functions more efficiently and to make better use of the portion of the device which is devoted to interconnecting individual logic modules.

It is therefore an object of this invention to provide improved programmable logic array integrated circuits.

It is a more particular object of this invention to provide programmable logic array integrated circuits with additional possibilities for interconnections between the logic modules.

It is a further object of this invention to provide improved techniques for organizing and interconnecting the programmable logic elements in programmable logic array integrated circuits.

SUMMARY OF THE INVENTION

These and other objects of the invention are accomplished in accordance with the principles of the invention by providing programmable logic array integrated circuits in which signal conductors are interconnected not by relatively large and complex programmable interconnections, but by relatively small and simple fixed interconnections to multiplexers which can then be programmed to effect the desired interconnections. Instead of having a signal conductor which crosses several other signal conductors programmably connectable to each of those other conductors by programmable elements at or near the intersection, a simple non-programmable transverse connection is made to each of those other conductors, and the transverse connections are applied in parallel to a multiplexer. The multiplexer can then be programmed to select one of its inputs as its output. The output of the multiplexer can be an input to a programmable logic element, an output from the integrated circuit, or a lead which is programmably connectable to one or more of several other conductors in the device.

Another interconnection technique which can be advantageously employed in accordance with the principles of this invention is to group the programmable logic elements into a plurality of mutually exclusive groups, each group having associated with it one or more conductors which can only be used to interconnect the elements in that group. In addition, there are other conductors which can be used to convey signals between the groups. Grouping the programmable logic elements in mutually exclusive (i.e., non-overlapping) groups helps to simplify the task of programming the device by breaking the device down into several discrete parts, each of which is smaller and more easily managed than the whole device. Providing signal conductors which serve only to interconnect the programmable logic elements in each group avoids tying up much longer conductors just to make short interconnections between adjacent programmable logic elements. This helps to reduce the required number of long conductors.

In the above-described arrangement in which the programmable logic elements are grouped and each group is uniquely associated with certain interconnection signal conductors, each programmable logic element may be augmented with a programmable output stage which can be used either to feed the output of that programmable logic element to conductors which go beyond the associated group or to the interconnect conductors of the associated group.

Multiplexers can also be used in combination with programmable signal conductor interconnections to allow certain of the conductors to be laid down more densely, to reduce the size of the interconnection array, and to reduce the capacitive loading on each output conductor of the array. Instead of one output conductor crossing a large number of parallel input conductors with a programmable interconnection at each intersection of the output conductor with the input conductors (which tends to force relatively wide spacing of the input conductors because of the relatively large size of the programmable interconnections), two substantially parallel output conductors feeding a programmably controlled output multiplexer are used. Each of these output conductors has a programmable interconnection only with every other one of the input conductors, and the input conductors which are thus connectable to one of the output conductors are interdigitated with the input conductors which are connectable to the other one of the output conductors. By thus spreading the programmable interconnections somewhat parallel to the longitudinal axes of the input conductors, the input conductors can be placed more closely together, which may save valuable space on the integrated circuit. This technique can also be used and further enhanced to reduce the number of programmable elements required to control the programmable interconnections between the input and output conductors if desired. In particular, a single programmable element can be used to control two interconnections, one of which is on one output conductor, and the other of which is on the other output conductor. The output multiplexer then makes the final selection of the desired output signal. Reducing the number of programmable elements in this way may be especially beneficial when the programmable elements are relatively large (e.g., as compared to the signal conductor interconnection elements they control). Indeed, it may be desirable to use more than two output signal conductors feeding the programmably controlled output multiplexer and to have each programmable element control one interconnection element on each of the more than two output conductors to still further reduce the required number of programmable elements.

Furthermore, other objects of the invention are accomplished in accordance with the principles of this invention by providing programmable logic array integrated circuits which basically employ a highly modular structure of logic elements and logic element interconnection pathways, but which also have one or more of several types of additional interconnection pathways for such purposes as making interconnections locally without tying up resources in the general interconnection structure. For example, such local interconnections may include carry chain interconnections between adjacent or nearby logic modules, or cascade logic connections between such modules in order to allow concatenation of the logic in those modules without recourse to the general interconnection structure. Where, as is preferred, the logic modules are grouped in logic array blocks ("LABS") which are in turn arranged on the integrated circuit in rows and columns, these additional local interconnections may not only be provided between logic modules within a LAB, but also to logic modules in the LABs in another (typically adjacent) row and/or column.

Alternative embodiments of LABs are disclosed. In one embodiment, a RAM-LAB which includes a memory block and control circuitry is disclosed. The memory block includes four columns of memory, each of which are divided into upper and lower portions. The control circuitry generates the necessary control signals to route the data and address information to the proper memory column in the memory block. The present invention provides for accessing the RAM-LAB directly by the user or via programming software during the initialization process. In the present invention, a RAM-LAB can be accessed using the network of so-called global horizontal and vertical conductors in addition to conductors associated with each RAM-LAB.

In embodiments employing a network of so-called global horizontal and vertical conductors, interconnections between those conductors are preferably made through tri-state drivers rather than mere passive connections in order to boost signals which may be required to travel relatively long distances through the circuit. Such drivers may alternatively or in addition be used on all logic module output signals which drive relatively long conductors on the circuit.

In addition to the network of global horizontal and vertical conductors typically used for making interconnections between all but relatively closely adjacent logic modules and connections to most of the input and output terminals of the circuit, another auxiliary network of horizontal and vertical conductors (so-called universal fast conductors) may be provided for distributing certain widely used logic signals such as clock and clear signals throughout the circuit. For example, conductors in this universal fast conductor network may be connectable to every logic module in the circuit.

Further features of the invention, its nature and various advantages will be more apparent from the accompanying drawings and the following detailed description of the preferred embodiments.

BRIEF DESCRIPTION OF THE DRAWINGS

FIGS. 5–9 are schematic diagrams showing alternative ways of making certain interconnections in circuits of the type shown in other drawings.

FIG. 14 is another view of the circuit of FIG. 10 showing an illustrative embodiment of additional elements of that circuit.

DESCRIPTION OF THE INVENTION

I. First Embodiment

Figure 1:
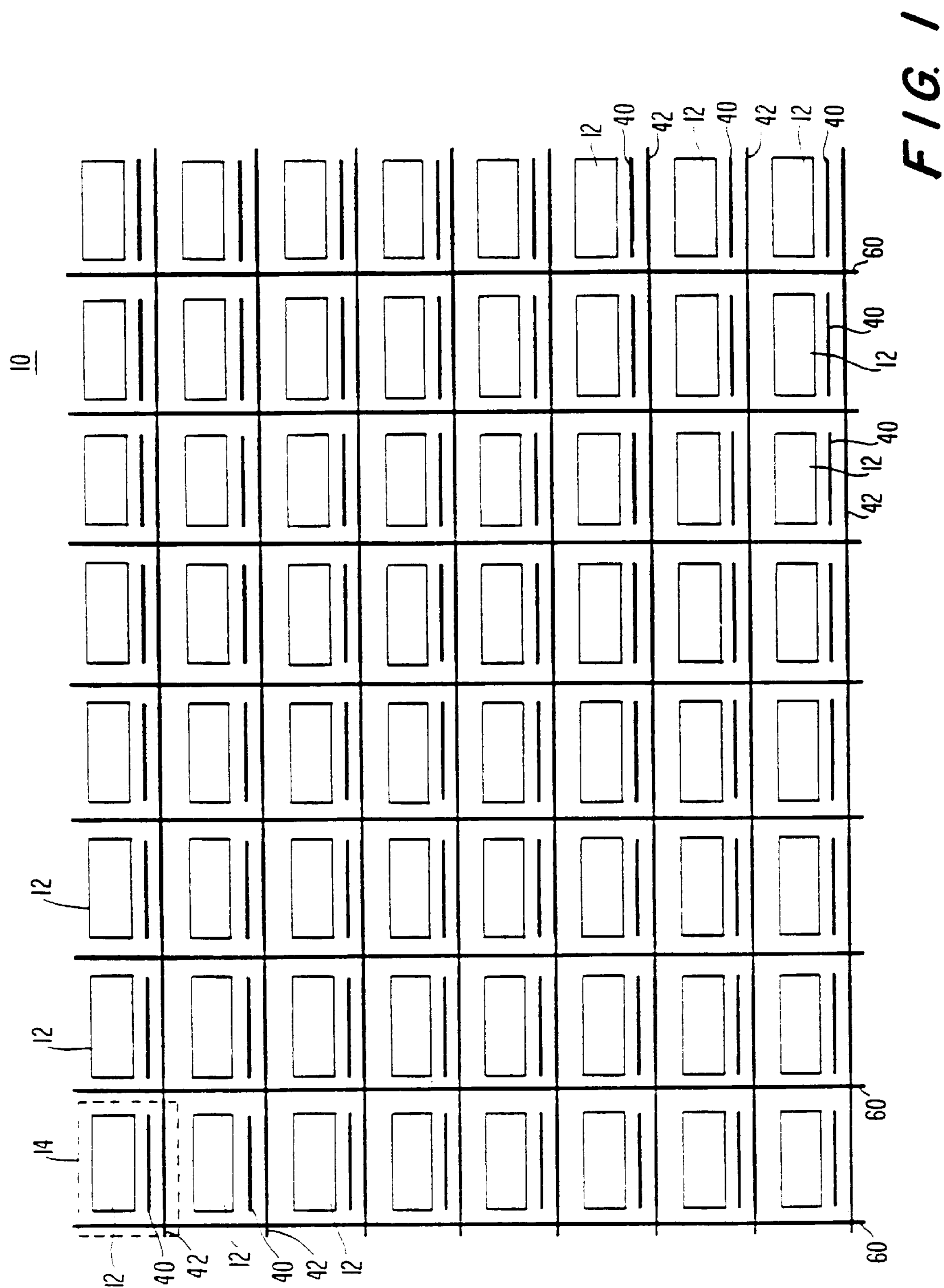
FIG. 1 is a simplified block diagram of a programmable logic array integrated circuit constructed in accordance with the principles of this invention.
Figure 2:
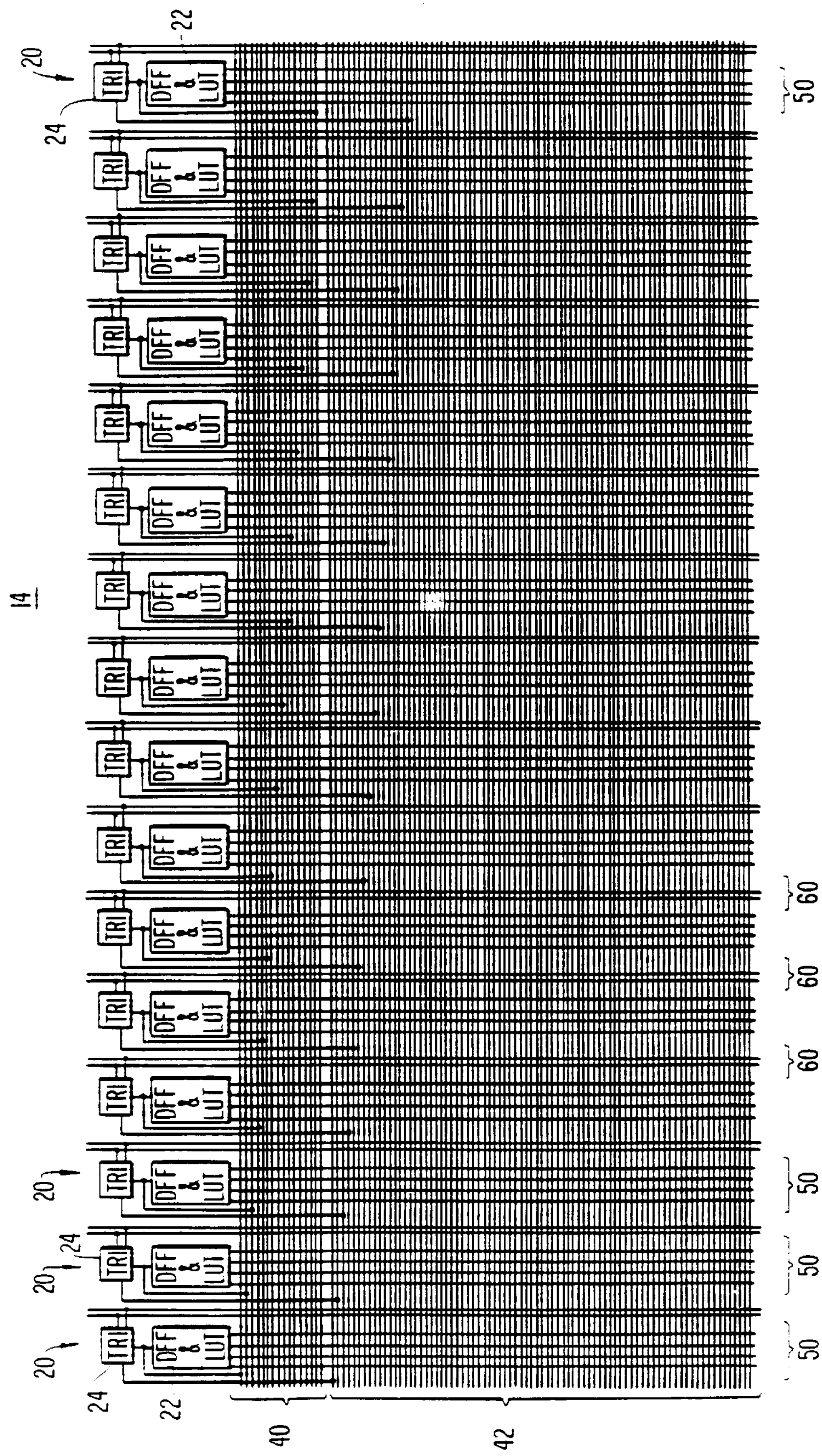
FIG. 2 is a more detailed block diagram of a representative portion of the circuit of FIG. 1.

As shown in FIG. 1, an illustrative programmable logic array integrated circuit 10 constructed in accordance with the first embodiment of the present invention includes a two-dimensional array of groups 12 of programmable logic elements. The representative portion of FIG. 1 which is surrounded by broken line 14 and which includes a typical group 12 is shown in more detail in FIG. 2. The structure shown in FIG. 2 is sometimes referred to herein as a logic array block or LAB. Accordingly, integrated circuit 10 (FIG. 1) is an eight by eight two-dimensional array of sixty-four LABs 14.

Figure 3:
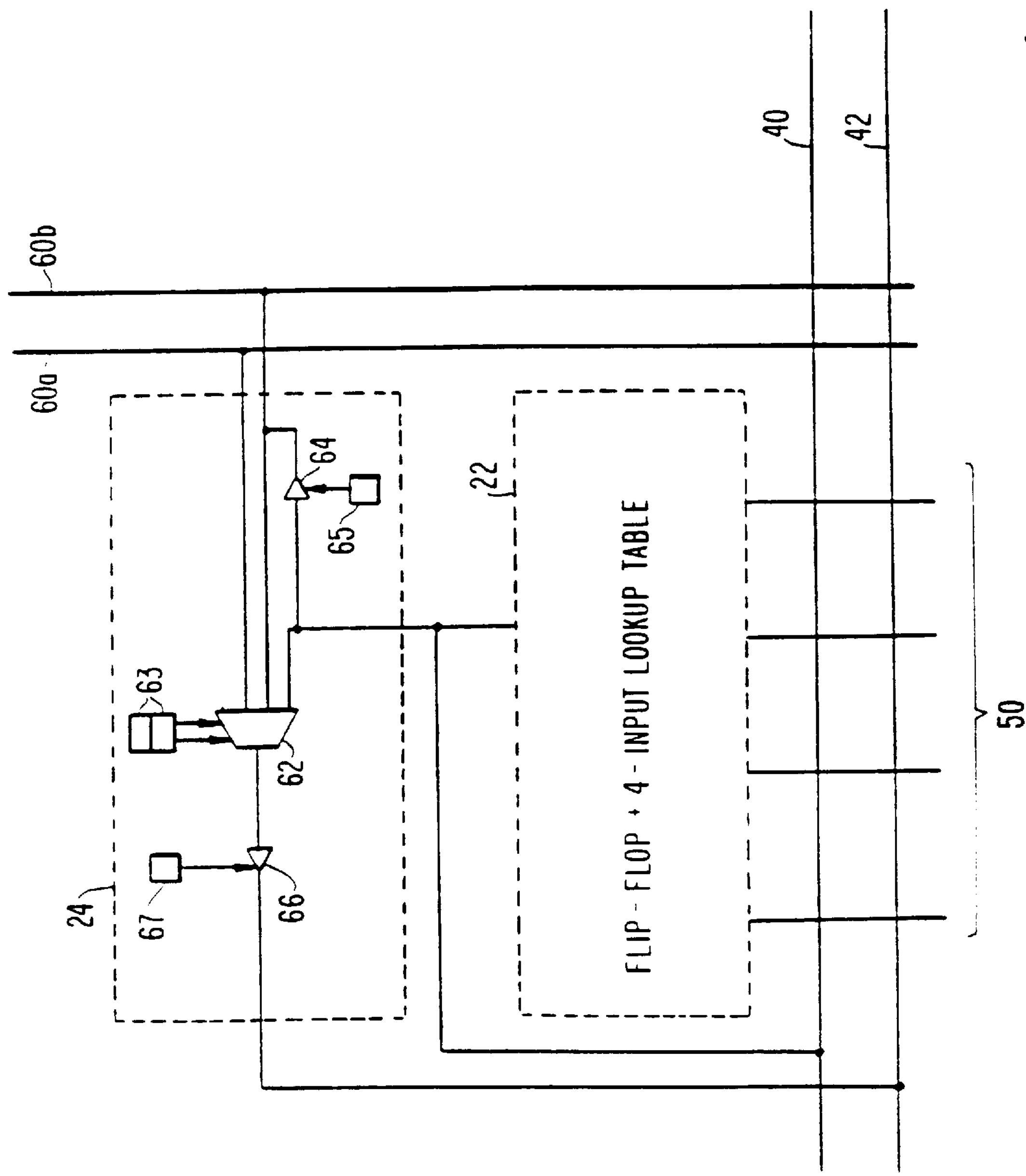
FIG. 3 is a still more detailed schematic block diagram of a representative portion of FIG. 2.
Figure 4:
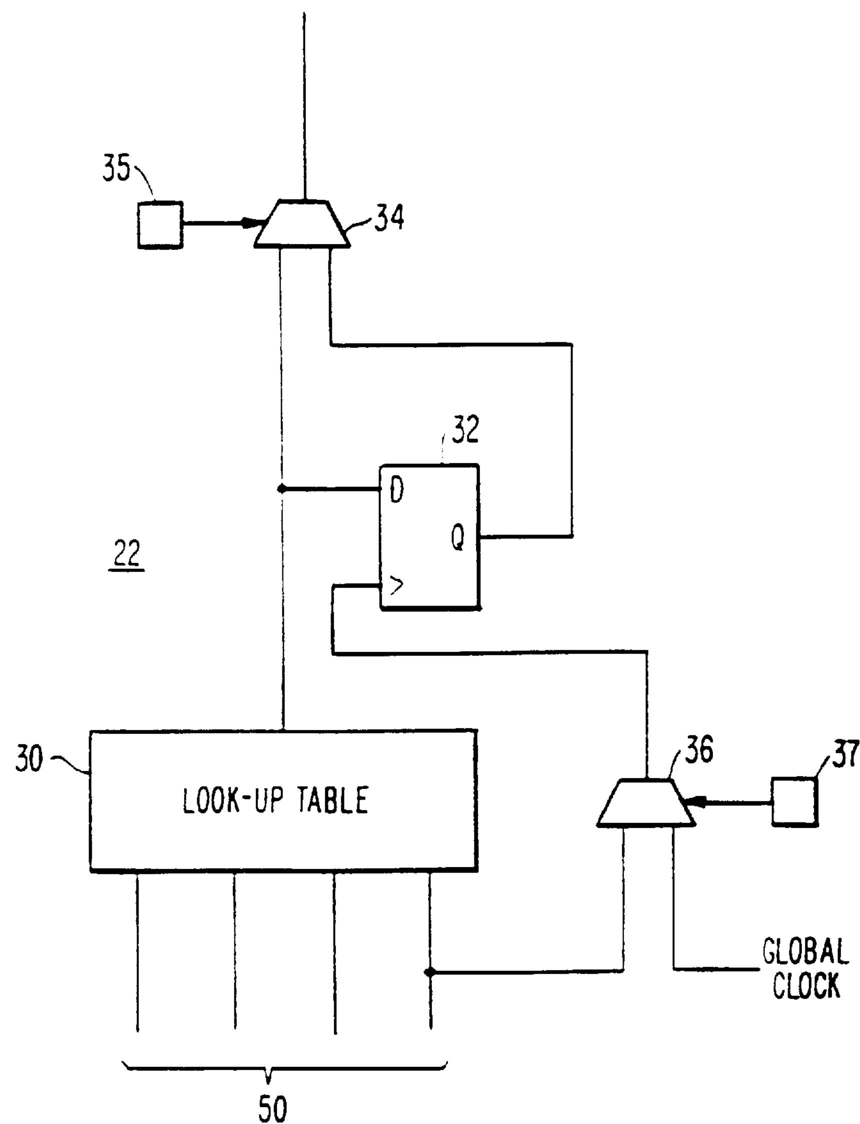
FIG. 4 is a schematic block diagram showing a portion of FIG. 3 in still more detail.

As can be seen in FIG. 2, each LAB 14 includes sixteen programmable logic elements or macrocells 20, a representative one of which is shown in more detail in FIG. 3. In particular, although other types of logic elements could be used instead, in the illustrative embodiment shown in FIG. 3 each programmable logic element 20 includes a D-type flip-flop and four-input look-up table element 22 (shown in more detail in FIG. 4) and tri-state driver logic 24. As shown in FIG. 4, each element 22 includes a four-input look-up table 30 which is programmable to produce a desired binary output signal value for each of the sixteen possible combinations of its four binary input signals. The output signal of look-up table 30 is applied to multiplexer 34 both directly and via D-type flip-flop 32. Flip-flop 32 can be clocked by either of the signals applied to multiplexer 36, i.e., by either a global clock signal or by one of the inputs to look-up table 30. Multiplexers 34 and 36 are controlled by conventional programmable elements 35 and 37 (e.g., RAM, EPROM, EEPROM, fuse, or antifuse elements).

Returning to FIG. 1, each LAB 14 has a plurality of signal conductors 40 (e.g., one for each of the programmable logic elements 20 in that LAB) which can be used to convey signals only between the programmable logic elements in that LAB (see also FIG. 2). Accordingly, the conductors 40 associated with each LAB are uniquely associated with that LAB and do not extend beyond that LAB. In addition, a plurality of signal conductors 42 is associated with each horizontal row of LABs 14. These signal conductors can be used to convey signals between LABs in the associated horizontal row of LABS. For example, eight such conductors 42 may be provided for each horizontal row of LABS. This is less than the number of programmable logic elements in each horizontal row, so some of conductors 42 are connected to the outputs of two programmable logic elements.

In addition to the above-described horizontal signal conductors, there are two types of vertical signal conductors other than those which have already been discussed. The first of these provide the four inputs to the look-up table 30 in each programmable logic element 20. These conductors are not shown in FIG. 1, but are identified by the reference number 50 in the other Figs. These conductors do not go outside the LAB of the associated programmable logic element. They allow the associated programmable logic element to receive input signals from the conductors 40 in the associated LAB and/or from the conductors 42 which pass through the associated LAB. Each conductor 50 may be programmably interconnectable to some or all of the horizontal conductors 40 and 42 that it crosses. Only one of the possible interconnections will generally be made at any one time.

Figure 6:
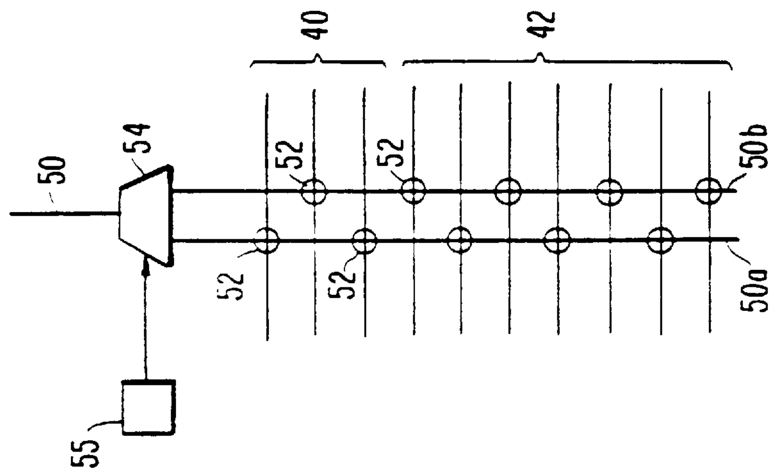
Figure 5:
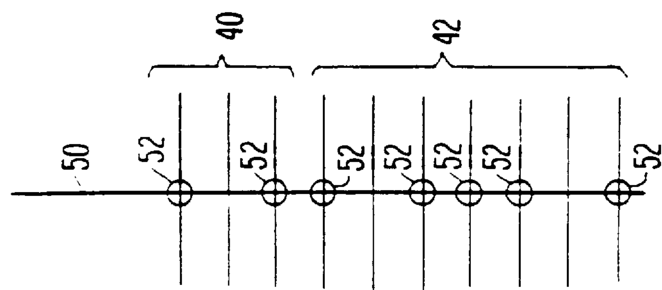
Figure 7:
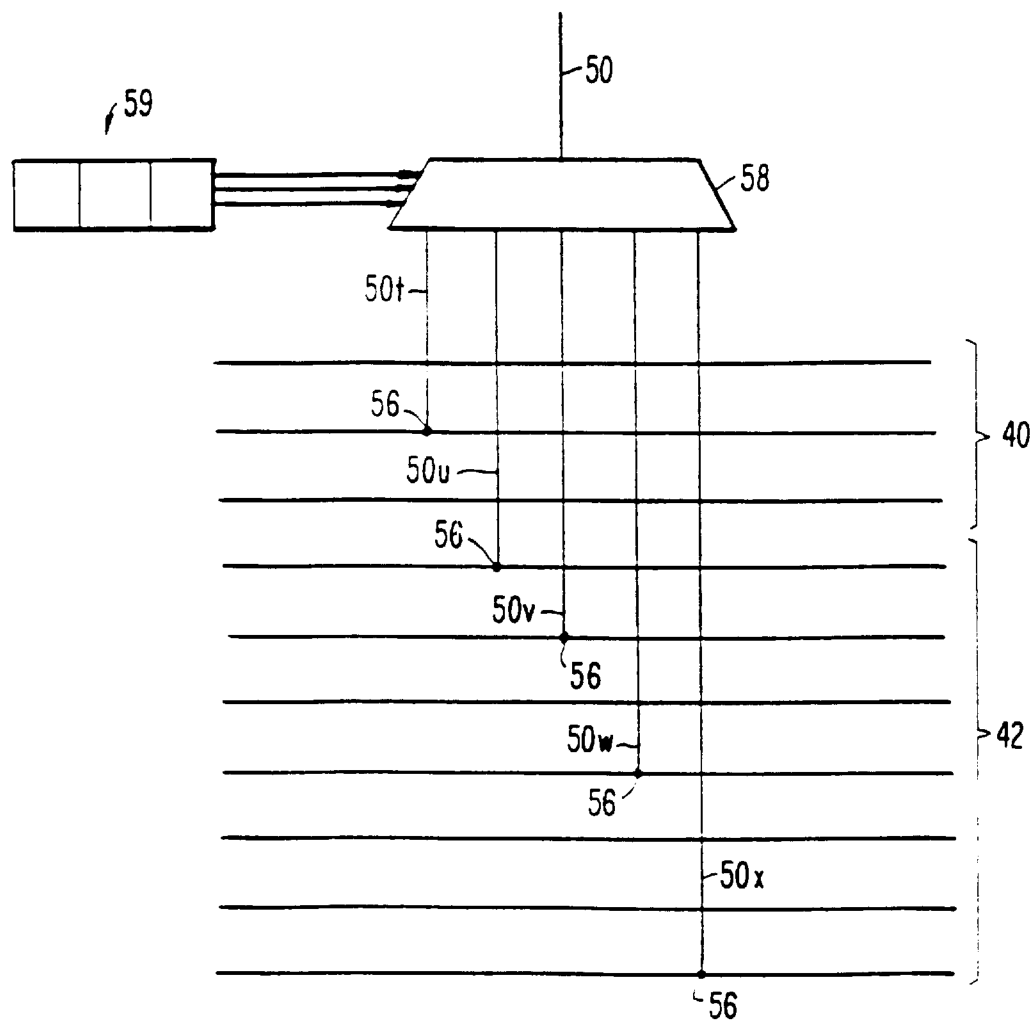

Conductors 50 can be configured in any of several ways. As shown in FIG. 5, for example, each conductor 50 can be a single line with programmable interconnections 52 to some or all of the horizontal conductors that it crosses. Alternatively as shown in FIG. 6, each conductor 50 can be the output signal of a multiplexer 54 which is fed by two (or more) conductors **50*a* and 50*b*. Each of conductors 50*a* and 50*b* has programmable interconnections 52 to a mutually exclusive subset of the input conductors crossed by 50*a* and 50*b*. These subsets are chosen so that no two adjacent input conductors 40 and 42 have programmable interconnections 52 to the same output conductors 50*a* and 50*b*. By thus spacing adjacent programmable interconnections parallel to the longitudinal axes of input conductors 40 and 42, it may be possible to place the input conductors closer together. This can be an important consideration given the large number of conductors on circuit 10. The capacitive loading on each of conductors 50*a* and 50*b* is less than it would be on a single conductor with the same total number of possible interconnections, thereby allowing faster operation of the device. Multiplexer 54 is controlled to connect one of its inputs 50*a* or 50*b* to its output 50 by programmable device 55. As another possible alternative shown in FIG. 7, each input conductor 40 and 42 which can be connected to output conductor 50 has a transverse branch conductor 50*t* through 50*x* connected to it by a fixed connection 56. These branch conductors are the inputs to a multiplexer 58 which can connect any one of its inputs to its output. Multiplexer 58 is controlled to make this connection by programmable elements 59. Fixed connections 56 can be made smaller than programmable interconnections, and they also reduce the load on input conductors 40 and 42 as compared to programmable interconnections such as 52 in FIGS. 5 and 6**.

When the technique shown in FIG. 6 is used, the number of programmable elements required to control the interconnection elements can be dramatically reduced if desired by employing the enhancement shown in FIG. 8. In particular, one programmable element 53 (e.g., a conventional RAM cell) is used to control one interconnection element 52 associated with each of the two or more output conductors **50*a* and 50*b* feeding multiplexer 54. (In FIG. 8 multiplexer 54 is shown in more detail as including pass transistors 54*a* and 54*b* respectively controlled by the “true” and “complement” output signals of programmable element 55.) Thus when any programmable element 53 is programmed to make an input conductor to output conductor connection, two such connections are made. The final selection of the desired connection is made by multiplexer 54. As compared to embodiments in which each interconnection element is controlled by a separate programmable element, the required number of programmable elements is dramatically reduced (i.e., by nearly one-half) by employing the technique shown in FIG. 8**. This can be especially important in the event that the programmable elements are relatively large (e.g., as compared to the interconnection elements) because significantly smaller interconnection arrays can be produced by reducing the number of programmable elements required in the array.

Although only two conductors **50*a* and 50*b* are shown feeding each multiplexer 54 in FIGS. 6 and 8, it will be understood that larger multiplexers fed by more than two conductors (e.g., four or eight conductors) can be used if desired in embodiments of the type shown in either of these Figs. In the case of FIG. 8 type embodiments with more than two conductors feeding each multiplexer, each programmable element 53 can control one interconnection element 52** associated with each conductor feeding a multiplexer. This allows an even greater reduction in the required number of programmable elements.

Figure 9:
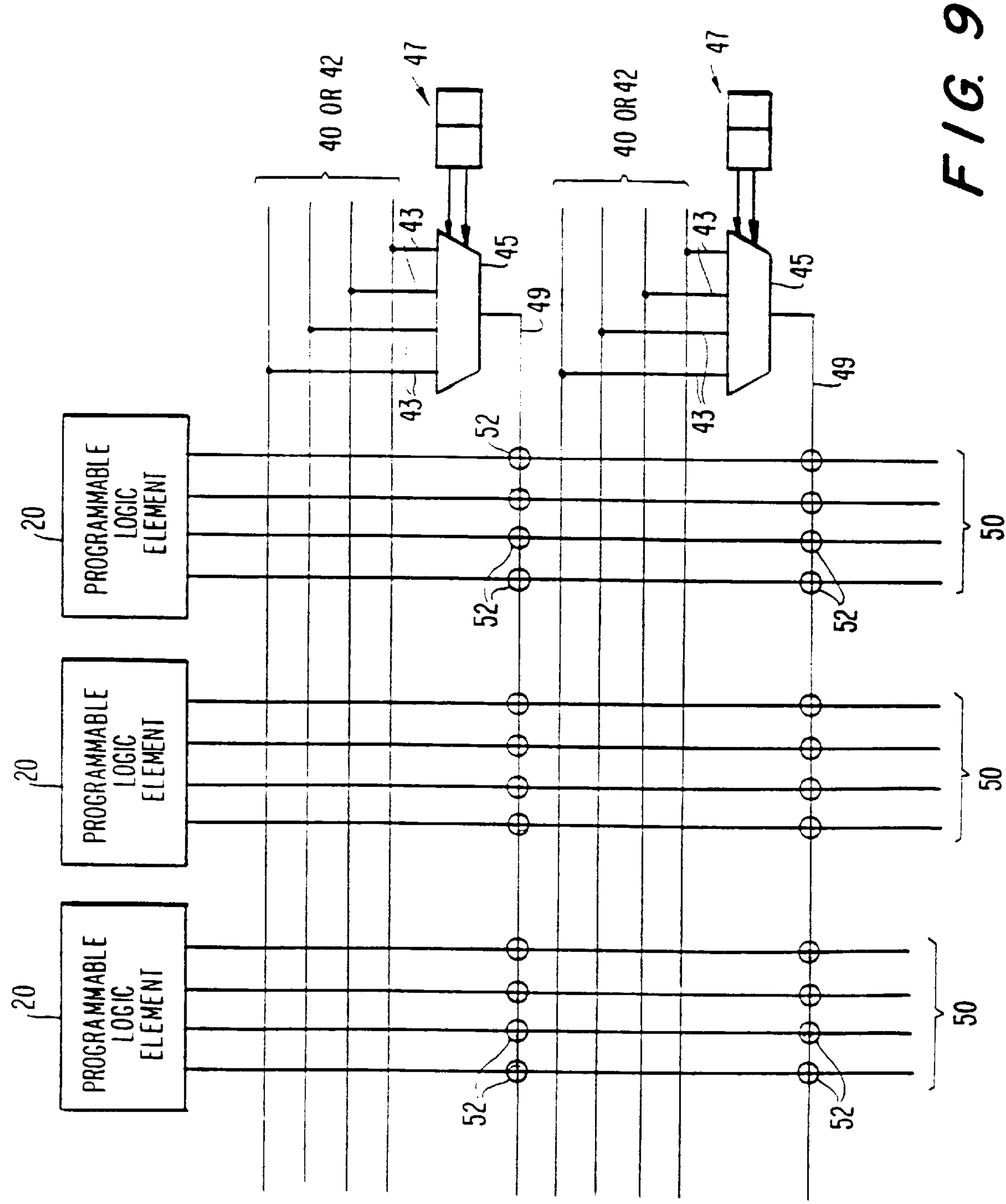

Another technique which can be used in accordance with this invention to provide interconnections between input conductors such as 40 and 42 and output conductors such as 50 is shown in FIG. 9. Instead of providing large numbers of programmable interconnections where input conductors 40 and 42 intersect output conductors 50, each input conductor has a transverse branch 43 fixedly connected to it. Several of these transverse branches are grouped as inputs to multiplexers 45. Each of multiplexers 45 is controlled by associated programmable elements 47 to select one of its inputs as its output 49. Each multiplexer output conductor 49 is extended (as an additional input conductor) across output conductors 50 and has programmable interconnections 52 to some or all of those output conductors. The technique shown in FIG. 9 reduces the size of the grid of intersecting conductors 40, 42, and 50 by reducing the number of programmable interconnections 52 that are employed. It also reduces the loading on input conductors 40 and 42.

Although the techniques described above in connection with FIGS. 6–9 are illustrated in the context of the signal conductors connected to logic elements 20, it will be understood that these techniques are equally applicable anywhere a cross point switch type interconnection is required between first and second groups of conductors on an integrated circuit.

Returning to the description of the vertical conductors in FIGS. 1–3, the other type of vertical conductors are identified by the reference number 60 in the Figs. These are the only vertical conductors that extend between the horizontal rows of LABs 14. As can be seen in FIG. 2 there are two conductors 60 associated with each programmable logic element position across the circuit. In other words, the left-most pair of conductors shown in FIG. 2 extend along the entire vertical dimension of circuit 10 and have the same relationship to the left-most programmable logic element in each horizontal row that they are shown to have in the representative LAB shown in FIG. 2.

The manner in which the two conductors 60 associated with each vertical column of programmable logic elements 20 are utilized is more apparent in FIG. 3. Conductor 60*a* is connected only to one input of multiplexer 62 in the tri-state driver 24 of representative programmable logic element 20. (In at least some other elements 20 in this vertical column, conductor 60*a* is instead connected in the manner shown for conductor 60*b* in FIG. 3.) Conductor 60*b* is connected both to an input of multiplexer 62 and the output of tri-state driver element 64. (In at least some other elements 20 in this vertical column, conductor 60*b* is instead connected in the manner shown for conductor 60*a* in FIG. 3.) Note that the remaining input to multiplexer 62 and the input to element 64 is the output of logic module 22. The output of multiplexer 62 is applied to tri-state driver element 66. The output of tri-state driver element 66 is connected to one of long horizontal conductors 42. The connection made by multiplexer 62 and whether each of elements 64 and 66 is on or off are controlled by programmable elements 63, 65, and 67.

From the foregoing it will be apparent that conductors 60 can be used to convey signals from one horizontal row of LABs 14 to another horizontal row. For example, a programmable logic element output signal applied to conductor 60*b* via element 64 in FIG. 3 can be output from the multiplexer 62 in any other vertically aligned programmable logic element (or elements) and thereby put on the horizontal conductor 42 to which that multiplexer output is connected. From that horizontal conductor 42 the signal can be picked up by any conductor 50 to which that horizontal conductor is connectable. Note that elements 62 and 66 can alternatively be used to apply the output signal of the associated logic module 22 to the associated long horizontal conductor 42 so that in addition to being available as an input to other programmable logic elements in the associated LAB (via the associated short horizontal line 40), that logic module output can also be made available for input to programmable logic elements in other LABs in the associated horizontal row. Tri-state driver module 24 allows the logic module output signal which is being used in this way to be simultaneously applied to one of conductors 60 via element 64. On the other hand, any tri-state driver module 24 which is not being used to apply the output signal of the associated logic module 22 to a long horizontal conductor 42 is free for use in connecting a vertical conductor 60*a* or 60*b* to that long horizontal conductor.

Inputs and outputs (not shown) to integrated circuit 10 can be connected in any desired manner (e.g., by connecting selected conductors 42 or 60 to input and/or output pads via suitable input and/or output drivers).

Grouping programmable logic elements 20 into mutually exclusive LAB groups, each with associated short horizontal conductors 40 for transferring data among the programmable logic elements in that group, not only helps to improve the organization of the circuit (thereby simplifying programming), but also greatly reduces the number of long conductors (e.g., 42) that are needed. This in turn saves valuable space on the circuit chip.

II. Second Embodiment

Figure 10:
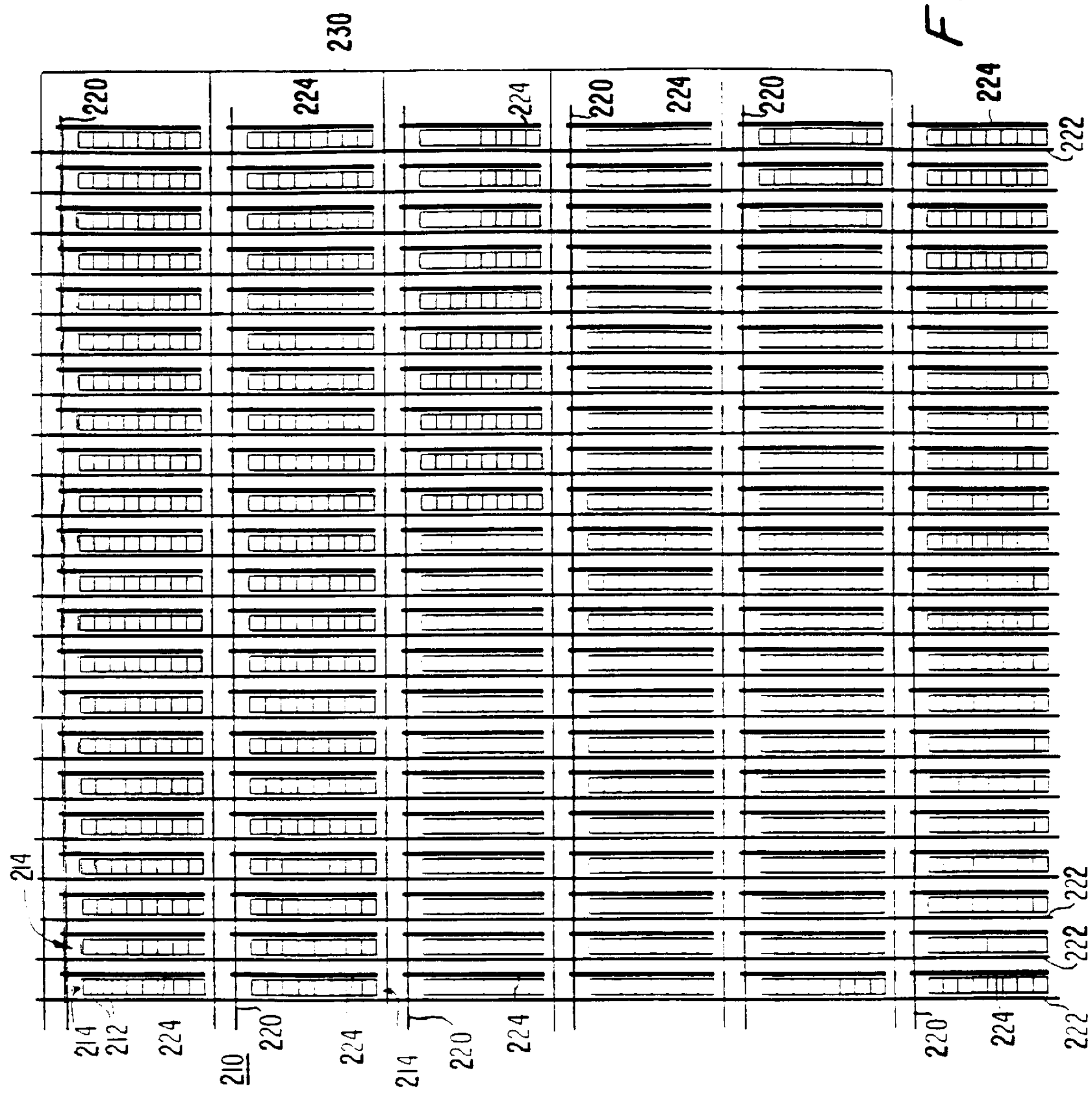
FIG. 10 is a simplified schematic block diagram of an illustrative programmable logic array integrated circuit constructed in accordance with the principles of the invention.

FIG. 10 shows the overall organization of an illustrative programmable logic array integrated circuit 210 constructed in accordance with the second embodiment of the present invention. Not all of the conductors employed in circuit 210 are shown in FIG. 10, but enough is shown in this Fig. to begin the discussion. Each logic module 212 is represented by a small square in FIG. 10. Logic modules 212 are grouped together in groups of eight. Each of these groups is referred to as a logic array block or LAB 214. LABs 214 are arranged in six horizontal rows and twenty two vertical columns on circuit 210. Accordingly, there are a total of one hundred thirty-two LABs 214 and one thousand fifty six logic modules 212 on circuit 210. Each logic module 212 is capable of performing a relatively elementary logic function (discussed in more detail below), but extremely complex logic can be performed by variously interconnecting the logic modules as will now be discussed.

The interconnection circuitry shown in FIG. 10 includes (1) groups of so-called global horizontal conductors 220 interspersed between the horizontal rows of LABS, and (2) groups of global vertical conductors 222 interspersed between the vertical columns of LABS. These conductors are global in the sense that they extend along an entire row or column. Programmable interconnections can be made between intersecting horizontal and vertical conductors in order to apply signals on the vertical conductors to the horizontal conductors. Each LAB 214 has a group of vertical LAB input conductors 224 for conveying signals from the global horizontal conductors 220 intersected by conductors 224 to the logic modules 212 in that LAB.

In addition to the above-described conductors, FIG. 10 shows part of a network of so-called universal fast conductors. The conductors 230 of this network shown in FIG. 10 extend throughout the entire circuit and can be used as will be described in more detail below to convey widely used logic signals such as clock and/or clear signals to any logic modules 212 on the circuit.

Although other numbers of conductors can be used if desired, in the depicted preferred embodiment, there are one hundred seventy six conductors in each group of global horizontal conductors 220, there are sixteen conductors in each group of global vertical conductors 222, there are twenty four conductors in each group of LAB input conductors 224, and there are four universal fast conductors 230.

Figure 11:
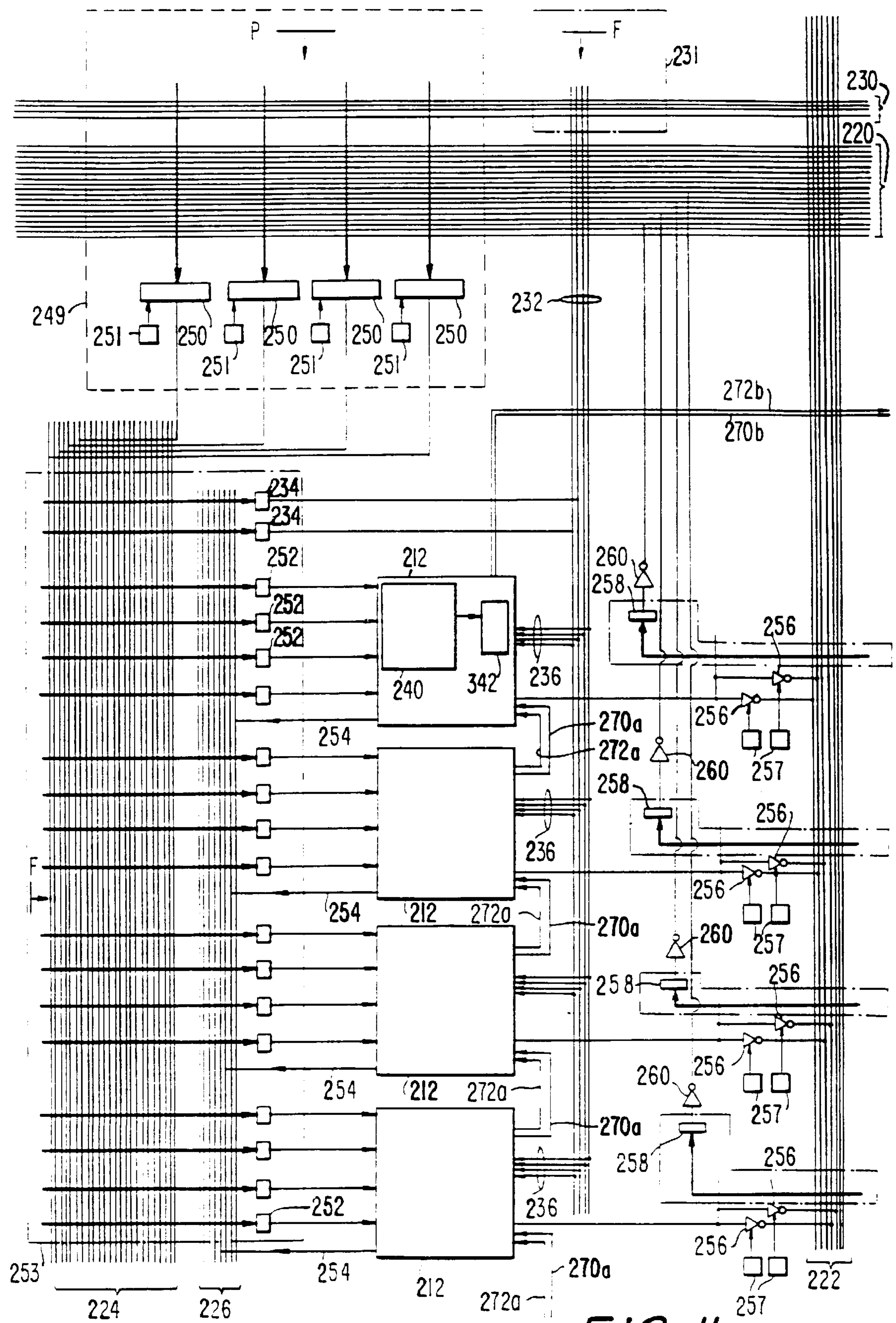
FIG. 11 is a more detailed schematic block diagram of an illustrative embodiment of a representative portion of the circuit shown in FIG. 10.
Figure 16A:
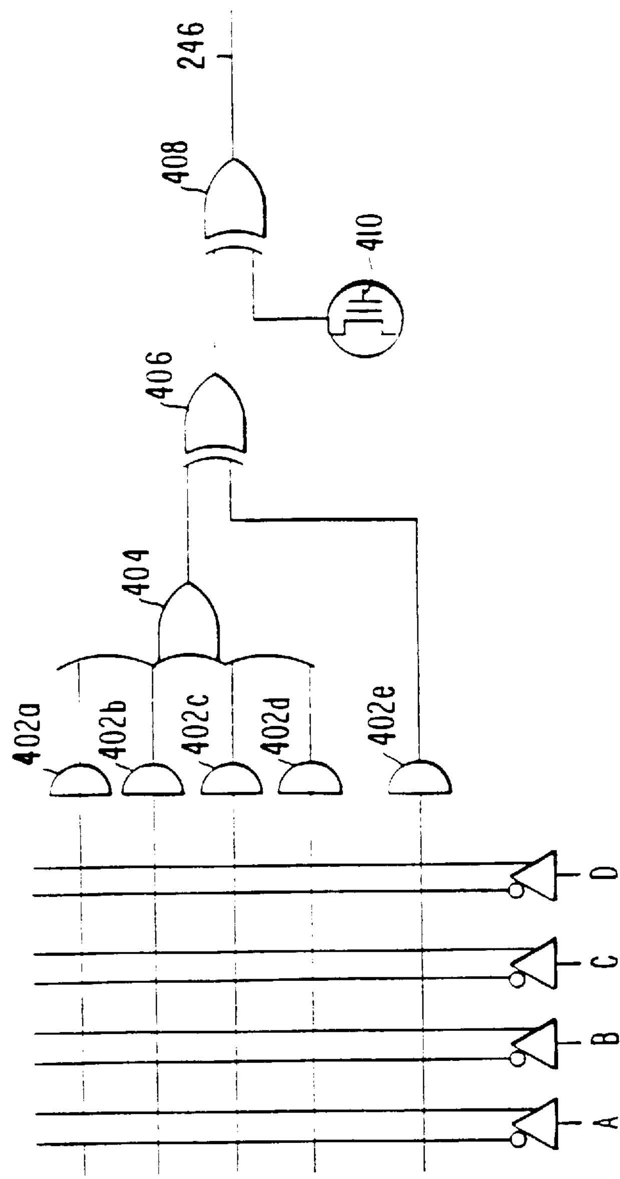
FIGS. 16A through 16C are schematic diagrams showing illustrative alternative embodiments of portions of the circuitry shown in FIG. 12.

Turning now to FIG. 11 which shows one possible implementation of part of a typical LAB 214 on circuit 210, four representative logic modules 212 are shown. Although logic modules 212 can be implemented in other ways (e.g., as product-term-based macrocells (an alternative which is discussed in more detail below, for example, in connection with FIGS. 16A–C)) in the illustrative embodiment shown in FIG. 11 each logic module 212 includes a look up table or universal logic block ("ULB") 240 and a flip-flop type device 342. Each look up table 240 is basically a circuit which can be programmed to produce an output signal which is any logical function of four input signals applied to the look up table. Each flip-flop 342 is a circuit which can be programmed either to store or to simply pass through the output signal of the associated look up table (see, for example, the circuit shown in Norman et al. U.S. Pat. No. 4,864,161). Alternatively, device 342 could be a flip-flop with no pass through or bypass capability.

In addition to the above-described representative logic modules, FIG. 11 shows portions of representative global horizontal conductors 220, global vertical conductors 222, LAB input conductors 224, and universal fast conductors 230. Each of LAB input conductors 224 can be connected to a selected one (or more) of conductors 220 and 230 via a programmably controlled programmable logic connector ("PLC") 250 (only some of which are shown in FIG. 11). PLCs 250 can be implemented in any of a wide variety of ways. For example, each PLC 250 can be a relatively simple programmable connector such as a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic implementing functions such as AND, NAND, OR, or NOR. Examples of components suitable for implementing PLCs 250 are EPROMs, EEPROMs, pass transistors, transmission gates, antifuses, laser fuses, metal optional links, etc. The components of PLCs 250 can be controlled by various function control elements ("FCEs") as described in more detail below (although with certain PLC implementations (e.g., fuses and metal optional links) separate FCE devices are not required, so that in those cases the depiction of FCE devices in the accompanying drawings merely indicates that the PLCs are programmable).

In the depicted, presently preferred embodiment each PLC 250 a 15-to-1 switch which is controlled by programmable function control elements ("FCEs") 251 on circuit 210 to connect one of its fifteen inputs to its output. Each of the fifteen inputs is the signal on a predetermined respective one of conductors 220 or 230. There is one PLC 250 for each of the twenty four LAB input conductors 224. Each of conductors 220 and 230 is connected to two of PLCs 250. Accordingly, each of conductors 220 and 230 is connectable to two of conductors 224. The letter P and the associated arrow symbol inside dotted line 249 indicate that the population of connections from conductors 220 and 230 to the inputs of each of PLCs 250 is a partial population.

FCEs 251 can also be implemented in any of several different ways. For example, FCEs 251 can be SRAMs, DRAMs, first-in first-out ("FIFO") memories, EPROMs, EEPROMS, function control registers (e.g., as in Wahlstrom U.S. Pat. No. 3,473,160), ferro-electric memories, fuses, antifuses, or the like.

Each of the four data inputs to each logic module 212 can be connected to any one (or more) of LAB input conductors 224 (and/or) any one (or more) of local conductors 226) via a PLC 252. PLCs 252 (and each similar PLC 234 which are discussed below) may have any of the characteristics described above for the general case of PLCs 250. However, in the depicted, presently preferred embodiment each of PLCs 252 (and each similar PLC 234) is a 32-to-1 switch so that any one of the 224 LAB input conductors 224 or any one of the eight local conductors 226 can be connected to each LAB data input. Accordingly, the letter F and the associated arrow symbol inside chain dotted line 253 indicate that the population of connections from conductors 224 and 226 to PLCs 234 and 252 is a full population. To avoid overcrowding the drawing, the FCEs (similar to above-described FCEs 251) for programmably controlling PLCs 234 and 252 are not shown separately, but rather are assumed to be part of elements 234 and 252.

Figure 18:
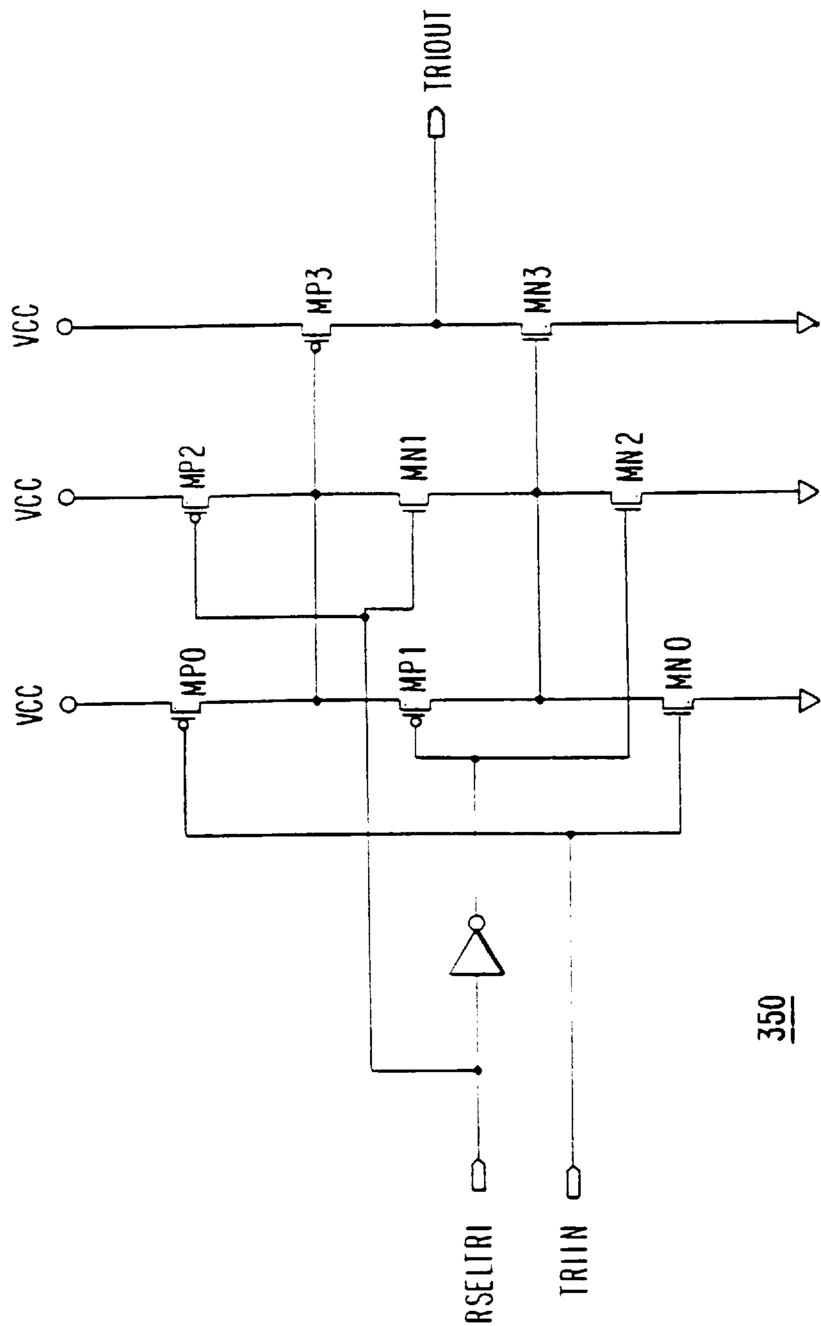
FIG. 18 is a schematic diagram of an illustrative embodiment of a representative element shown in FIG. 11.

The data output of the flip-flop 342 in each logic module 212 can be applied (via conductor 254) to a respective one of local conductors 226. These conductors serve only the logic modules in the associated LAB 214. In other words, conductors 226 do not extend beyond the associated LAB. The data output of the flip-flop 342 in each logic module 212 can also be applied to either or both of two global vertical conductors 222 (via tri-state drivers 256), and to one of global horizontal conductors 220 (via PLC 258 and tri-state driver 260). The other input or inputs to each PLC 258 are the signals from one or more of global vertical conductors 222. Accordingly, global vertical conductors 222 are selectively connectable to global horizontal conductors 220 via PLCs 258 and tri-state drivers 260. PLCs 258 may be similar to any of the above-described PLCs. The use of tri-state drivers 256 and 260 is advantageous to strengthen signals which may be required to travel relatively long distances throughout circuit 210 and/or which may be inputs to relatively large numbers of other components. A suitable tri-state driver is shown in FIG. 18 and described in detail below. Some or all of tri-state drivers 256 and 260 may be controlled (i.e., turned on or off) by FCEs (e.g., FCEs 257) on circuit 210. PLCs 258 are also typically controlled by FCES on the circuit. All of these FCEs may be similar to above-described FCEs 251.

In addition to being available as data inputs to logic modules 212, the signals on any of conductors 224 and 226 can also or alternatively be applied to any of local vertical conductors 232 via PLCs 234. In the depicted, presently preferred embodiment, each of PLCs 234 is a 32-to-1 switch, but PLCs 234 can alternatively have any of the characteristics described above for the general case of PLCs 250. Although only two PLCs 234 are shown in FIG. 11, there is preferably one such PLC for each of the four conductors 232. Each of conductors 232 is connectable to any one of universal fast conductors 230 for receiving the signal on the fast conductor. These connections from conductors 230 to conductors 232 are preferably made in the same way that the connections from conductors 224 and 226 to conductors 232 are made, i.e., by PLCs controlled by FCEs (all represented by element 231 in FIG. 11). Again, although each of these PLCs can have any of the characteristics described above for the general case of PLCs 250, in the depicted, presently preferred embodiment each of these PLCs can connect any of conductors 230 to an associated one of conductors 232. The letter F and the arrow symbol inside chain dotted line 231 indicate that the population of possible connections from conductors 30 to each of conductors 232 is a full population. Each of conductors 232 is connectable (via conductors 236) to each of logic modules 212. FCE-controlled PLCs in each logic module allow these signals to be used for such purposes as flip-flop clock and flip-flop clear (see FIG. 17 (discussed below) which shows an illustrative logic module 12 in more detail). Thus local vertical conductors 232 are known as clock and clear lines and can be driven from fast lines 230 for synchronous clocks and clears (i.e., clocks and clears which come from outside of device 210 and are available everywhere throughout device 210), or from LAB input lines 224 or local lines 226.

There are two other types of logic module interconnections shown in FIG. 11 which require discussion. The first of these is carry chain interconnection represented in part by conductors 270*a* and 270*b*. These interconnections allow a carry out output of each logic module 212 to be used as a carry in input to an adjacent or nearby logic module as shown, for example, in commonly assigned, co-pending patent application Ser. No. 07/880,752 (see also FIG. 17 herein). For example, carry chain conductors 270*a* allow the carry out output of each logic module 212 shown in FIG. 11 to be the carry in input to the next higher logic module in that Fig. Similarly, carry chain conductor 270*b* runs from the top-most logic module 212 in the LAB fragment shown in FIG. 11 to the bottom-most logic module in the horizontally adjacent LAB in the adjacent column of LABS. This allows the carry chain to continue from LAB to LAB if desired.

The other type of logic module interconnection remaining to be discussed is illustrated by representative conductors 272*a* and 272*b* in FIG. 11 (see also commonly assigned, co-pending application Ser. No. 07/880,888). These conductors are called cascade connect conductors. They allow the data outputs of adjacent or nearby logic modules 212 to be logically combined, if desired, to perform more complex logic functions without the need to pass intermediate data through the general interconnection network. The manner in which cascade connect conductors 272 are employed in the logic modules is shown in detail in FIG. 12.

Figure 12:
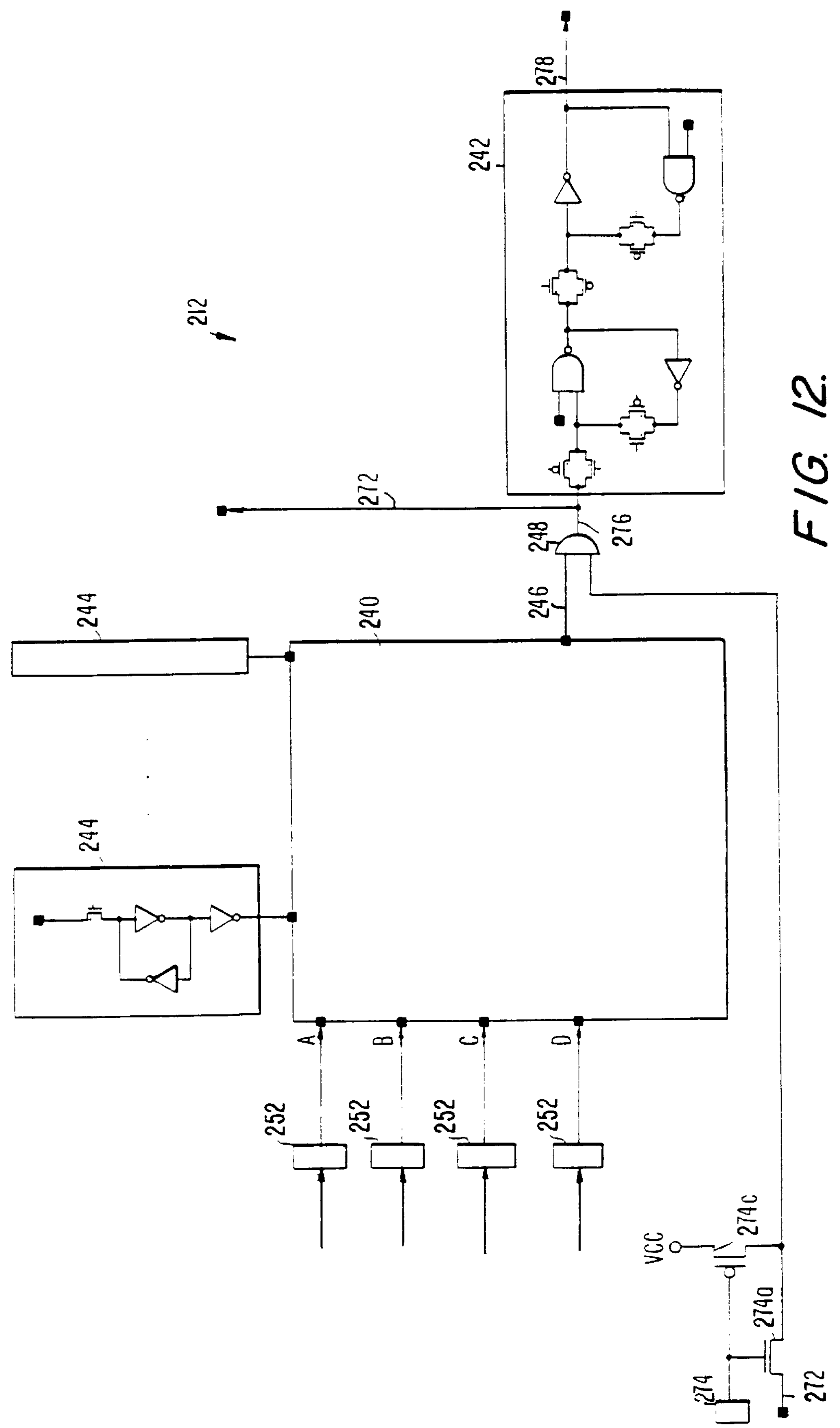
FIG. 12 is a still more detailed schematic block diagram of an illustrative embodiment of a representative portion of the circuitry shown in FIG. 11.

As shown in FIG. 12, a typical logic module 212 includes look up table or ULB 240 which is controlled by 216 FCEs 244 to produce on data output lead 246 any desired logical function of the four data input signals from PLCs 252. (Although in the particular embodiment shown in FIG. 12 a representative FCE 244 is depicted as a RAM cell, it will be understood that FCEs 244 can be implemented in any of a wide variety of ways as discussed above in connection with FCEs 251). The signal on lead 246 is applied to one input of AND gate 248. (Although shown as an AND gate in FIG. 12, cascade connect device 248 could alternatively be any other suitable two-input logic function such as an EXCLUSIVE OR gate.) The other input to AND gate 248 is the cascade connect input from another logic module 212 gated by transistor 274*a* which is controlled by FCE 274*b* (similar to previously described FCES). (If transistor 274*a* is disabled by FCE 274*b*, then transistor 274*c* is enabled to connect the second input of AND gate 248 to a source of logical 1 potential.) Accordingly, assuming that transistor 274*a* is enabled, AND gate 248 produces an output signal on lead 276 which is the logical AND of the signals on incoming leads 246 and 272. The signal on lead 276 can therefore be a significantly more complex logic function than could be produced by one look up table 240 by itself. In addition to being applied to flip-flop 242 and then by way of lead 278 and elements 254, 256, 258, and 260 to the more general interconnection structure, the signal on lead 276 is also applied to another cascade connect conductor 272 for cascade connection to another adjacent or nearby logic module 212 in the same way that the incoming lead 272 shown in FIG. 12 is connected to the logic module shown in that Fig.

FIG. 11 shows that each cascade connect conductor 272*a* from a logic module 212 is connected to the next higher logic module in that Fig. The cascade connect output from the top-most logic module 212 in FIG. 11 goes (via cascade connect conductor 272*b*) to logic modules in an adjacent column of LABs (e.g., to the bottom-most logic modules in the LAB immediately to the right of the LAB fragment shown in FIG. 11).

Figure 13:
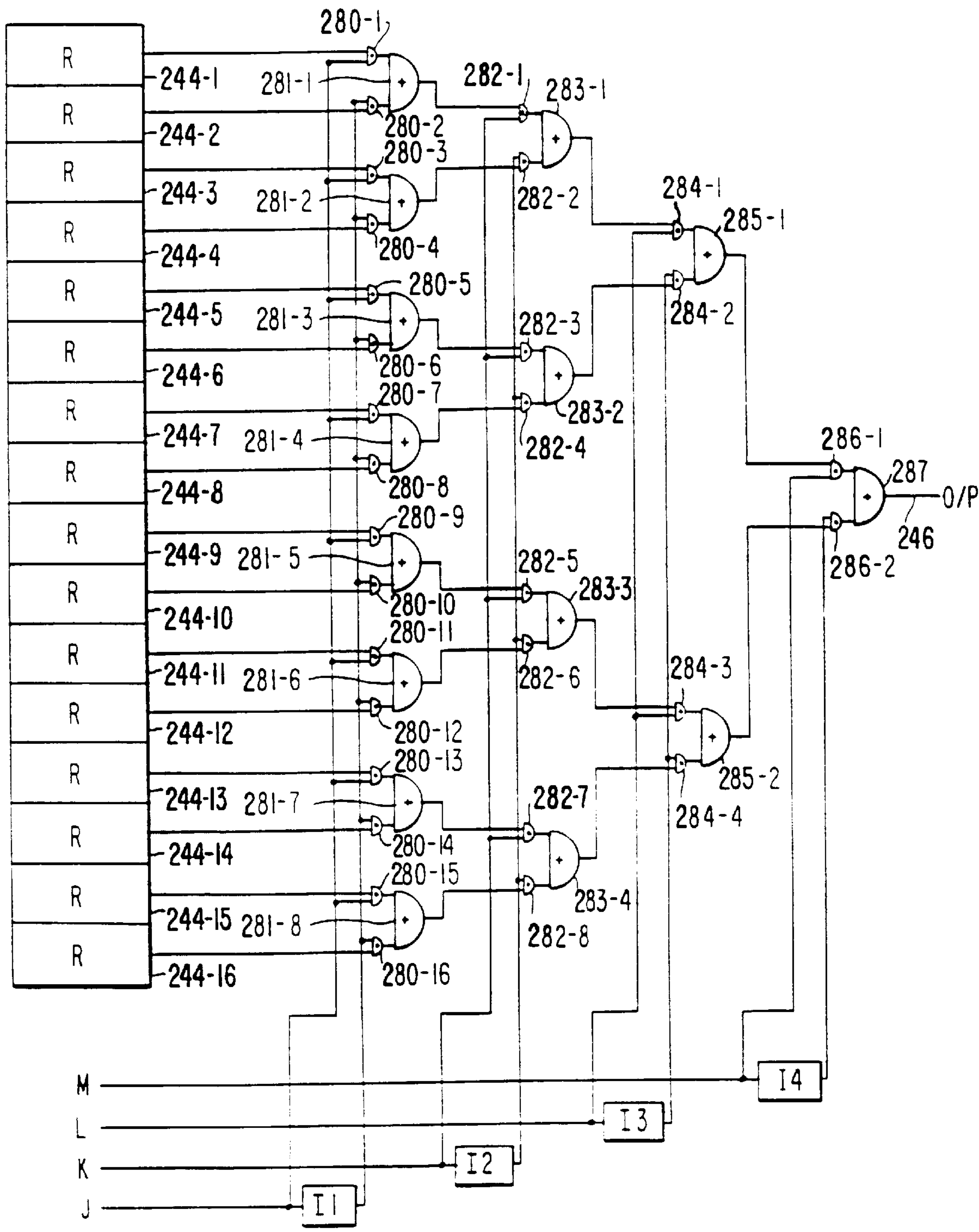
FIG. 13 is a schematic block diagram of an illustrative embodiment of a portion of the circuitry shown in FIG. 12.

FIG. 13 shows a typical basic look up table 240 in more detail. (Look up table 240 may be modified as shown in above-mentioned application Ser. No. 07/880,752 to facilitate performance of fast carry logic, but FIG. 13 shows the basic structure of a four-input look up table.) This table is controlled by sixteen FCEs 244. The output signal of each of these FCEs is applied to a respective one of sixteen AND gates 280. Alternate ones of AND gates 280 are respectively controlled by the true and complement of the first data input J, the complement of input J being produced by inverter I1. The outputs of adjacent pairs of switches 280 are then combined by OR gates 281 and applied to eight AND gates 282. Alternate ones of AND gates 282 are respectively controlled by the true and complement of the second data input K, the complement of input K being produced by inverter I2. The outputs of adjacent pairs of AND gates 282 are combined by OR gates 283 and then applied to four AND gates 284. Alternate ones of AND gates 284 are respectively controlled by the true and complement of the third data input L, the complement of input L being produced by inverter I3. The outputs of adjacent pairs of AND gates 284 are combined by OR gates 285 and applied to two AND gates 286. One of AND gates 286 is controlled by the true of the fourth data input M, while the other AND gate 286 is controlled by the complement of that input (produced by inverter I4). The outputs of AND gates 286 are combined by OR gate 287 to produce the data output on conductor 246. It will be apparent from the foregoing that any desired logical function of data inputs J–M can be produced by appropriately programming FCEs 244.

Figure 14:
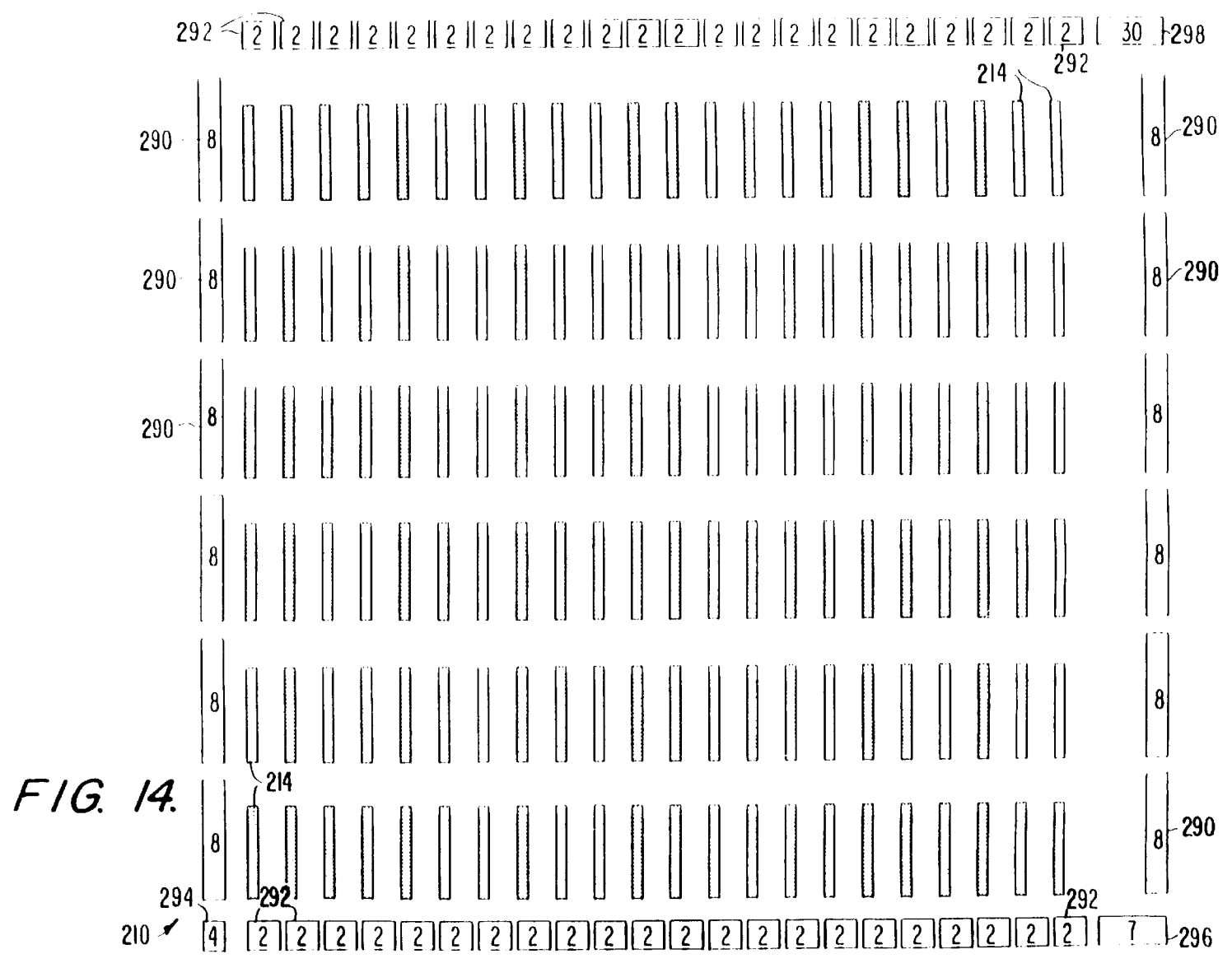

FIG. 14 shows how input/output pins may be provided on circuit 10. Six groups 290 of eight input/output pins are shown along each side of circuit 210. Twenty-two groups 292 of two input/output pins are shown along each of the top and bottom of the circuit. In addition, there are four fast input pins 294 respectively connected to fast conductors 230, seven control pins 296 for use during programming of device 210, and approximately thirty supply pins 298 for supplying power and ground potential to device 210.

Figure 15A:
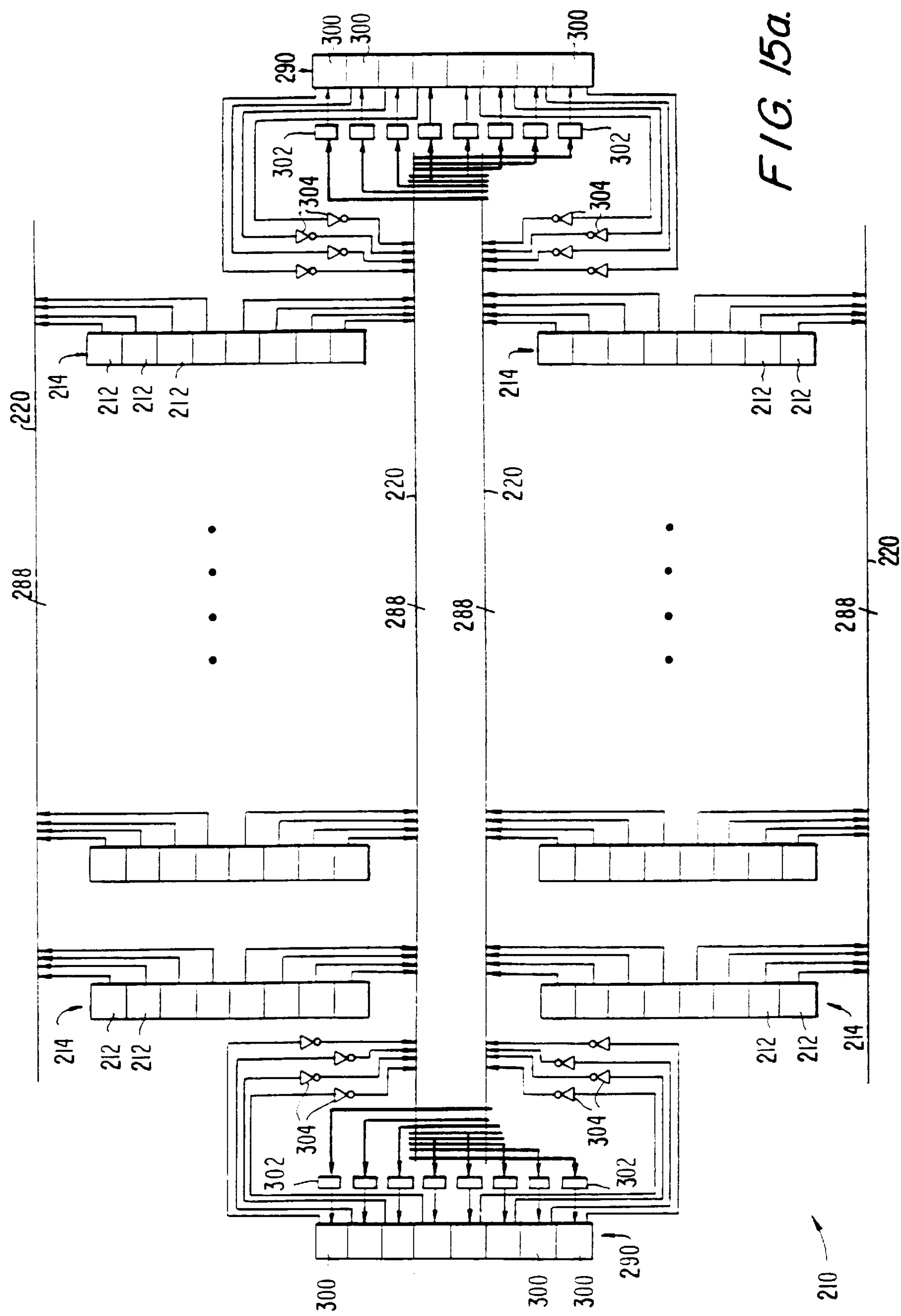
FIGS. 15A and 15B are schematic block diagrams showing an illustrative embodiment of representative portions of FIG. 14 in more detail.
Figure 15B:
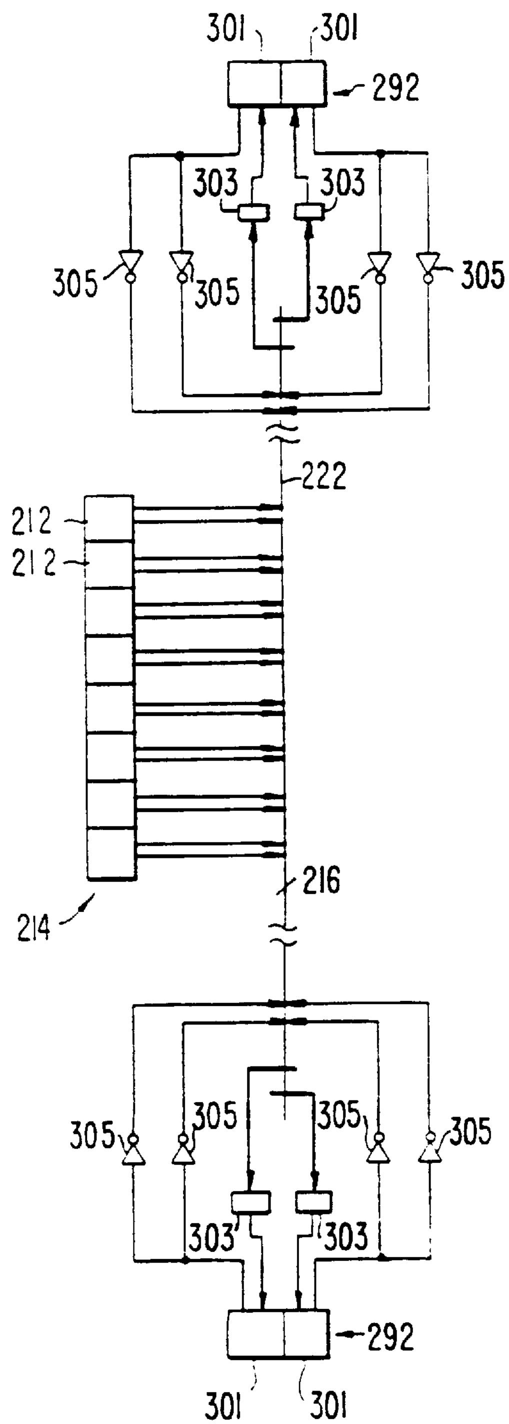

Although other arrangements for connecting the conductors on device 210 to its input/output pins are possible, FIGS. 15A and 15B show parts of an illustrative embodiment of such an arrangement. In FIG. 15A the one hundred seventy six global horizontal conductors 220 associated with each horizontal row of LABs 214 are arranged so that half can receive the outputs of the drivers 260 (FIG. 11) associated with the top four logic modules 212 in each LAB in that row, while the other half of these conductors 220 can receive the outputs of the drivers 260 associated with the lower four logic modules 212 in each LAB in that row. Accordingly, in FIG. 15A each group of one hundred seventy six global horizontal conductors 220 is shown divided into two subgroups of 288 such conductors, one subgroup being above the associated row of LABs 214, and the other subgroup being below that row of LABS. Each input/output pin 300 in each group 290 of such pins can receive an output via a PLC 302 from the conductors 220 in two subgroups of 288 such conductors. (Again, PLCs 302 can have any of the characteristics described above for the general case of PLCs 250, and PLCs 302 are controlled by programmable FCEs similar to those described above.) One of these two subgroups of conductors is associated with the lower logic modules 212 in one row of LABs 214, while the other subgroup of conductors is associated with the upper logic modules 212 in the LAB row immediately below the first row.

For use as an input pin, each pin 300 is connected through two tri-state drivers to two of conductors 220. Thus each symbol 304 in FIG. 15A represents two tri-state drivers, each of which is programmably controlled (e.g., by an FCE similar to those described above).

In FIG. 15B the sixteen global vertical conductors 222 associated with each vertical row of LABs 214 are split into two groups of eight conductors at the top and bottom of the device. Each group of eight conductors is applied to a respective one of PLCs 303 (similar to the above-described PLCS). Each PLC 303 applies one (or more) of the signals applied to it to an associated input/output pin 301. For use as an input pin, each pin 301 is connected through two programmable tri-state drivers 305 to two of conductors 222.

As mentioned above, logic modules 212 can be implemented in other ways. For example, the portion of each logic module 212 which is described above as a look up table 240 can alternatively be implemented as sum-of-products logic of the type shown in FIG. 16A. The particular logic shown in FIG. 16B is of the well known "programmable AND, fixed OR" type. In this logic the true or complement of any of inputs A–D (which correspond to signals A–D in FIG. 12) is programmably connectable to each of AND gates 402*a–e*. Accordingly, each of these AND gates produces the logical "product" of the inputs connected to it. These products are sometimes referred to as "product terms" or "pterms". The outputs of AND gates 402*a–d* are all applied to OR gate 404. The output signal of OR gate 404 is therefore the logical "sum" of the applied pterms. The output of OR gate 404 is applied to EXCLUSIVE OR gate 406. The other input to gate 406 is pterm 402*e*. Accordingly, pterm 402*e* can be used (in conjunction with gate 406) to selectively invert or otherwise gate the sum-of-products output of OR gate 404. The output of gate 406 is applied to EXCLUSIVE OR gate 408. The other input to gate 408 is the output signal of programmable FCE 410 (similar to the other FCEs described above). Accordingly, FCE 410 can be used (in conjunction with gate 408) to selectively invert the output of gate 406. The output of gate 408 can be applied, inter alia, to the data input of the register 242 of the logic module.

Another example of a possible alternative construction of logic modules 212 is shown in commonly assigned U.S. Pat. No. 5,121,006, issued Jun. 9, 1992, which is hereby incorporated by reference. The macrocell structure 100 shown and described in that patent application can be readily employed as the logic module 212 in the programmable logic array structures of this invention.

Figure 16C:
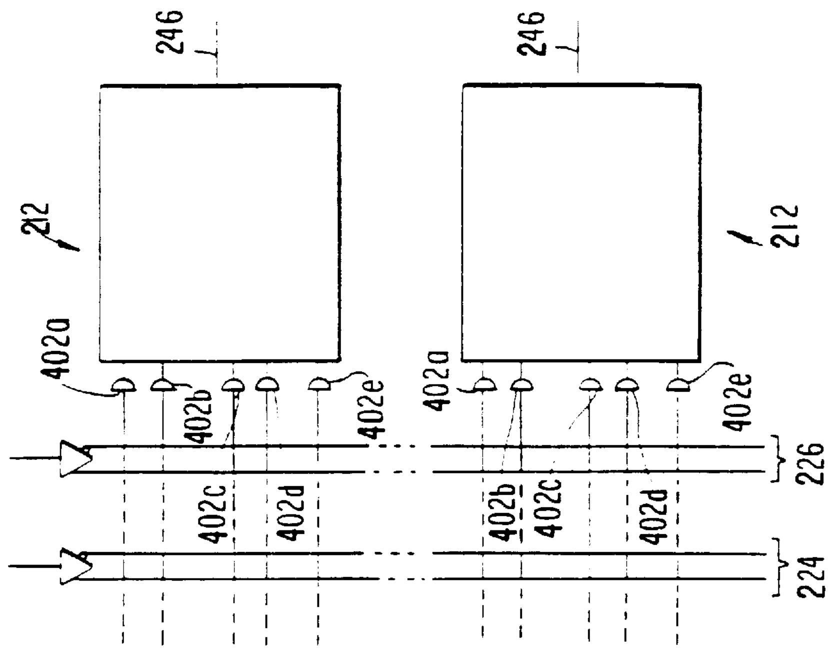
Figure 16B:
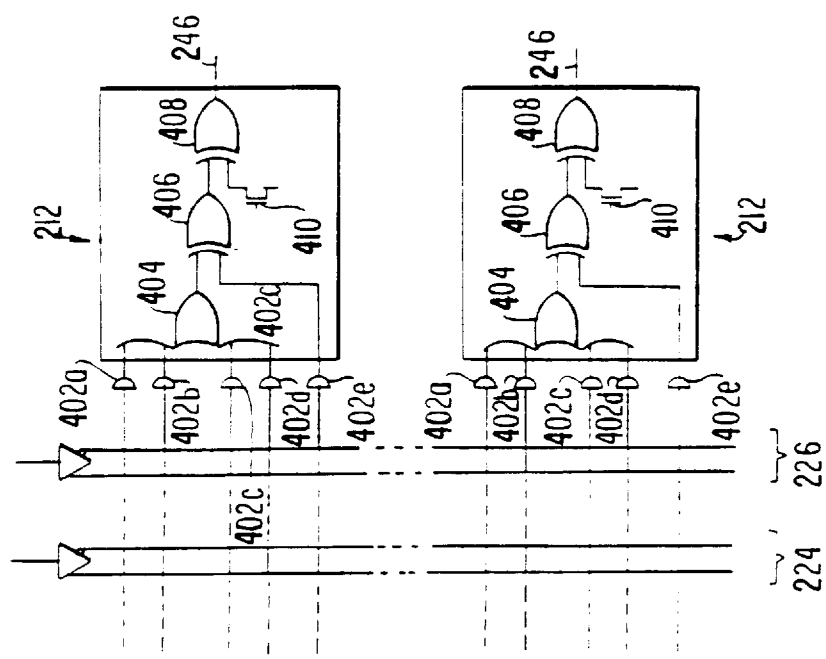

Still other examples of possible logic module construction are shown in FIGS. 16B and 16C. In FIG. 16B each conductor 224 and 226 (corresponding to conductors 224 and 226 in FIG. 11) is present in both the true and complement form. Pterms are formed in programmable connections between these conductors and the inputs to AND gates 402*a–e*. The remainder of each FIG. 16B logic module may then be similar to the corresponding portion of the circuitry shown in FIG. 16A.

In the further alternative shown in FIG. 16C, the circuitry outside the rectangular boxes may be identical to the corresponding portion of FIG. 16B. The circuitry represented by each rectangular box in FIG. 16C may be the macrocell structure 100 shown in above-mentioned application Ser. No. 688,252.

Figure 17:
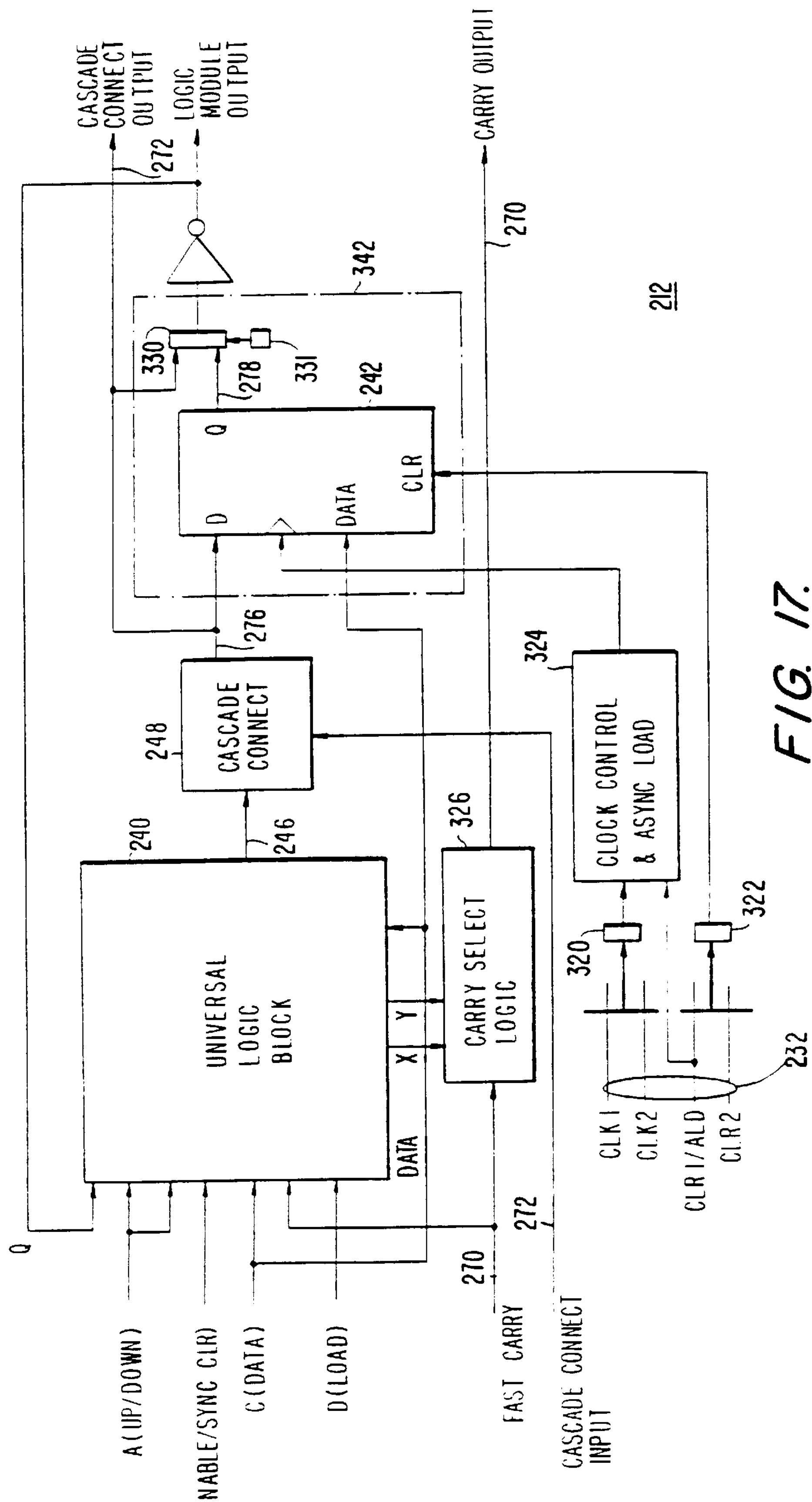
FIG. 17 is another more detailed schematic block diagram of an illustrative embodiment of a representative portion of FIG. 11.

FIG. 17 is another depiction of an illustrative logic module 212 in accordance with this invention. Certain features shown in FIG. 17—especially those related to the implementation of fast carry logic and the use of logic modules of this type in adders and counters —are shown in even more detail in above-mentioned application Ser. No. 07/880,752. For example, that application explains that input C is applied to flip-flop 242 as data (in addition to being applied to universal logic block 240) to facilitate loading data into the flip-flop when logic module 212 is to be used as one stage of a loadable counter. Cascade connect input 272 is applied as one input to logic element 248 (typically an AND gate as described above in connection with FIG. 12). The desired signals on clock and clear lines 232 are selected by programmable (i.e., FCE-controlled) PLCs 320 and 322. The output of PLC 322 is applied to the clear input terminal of flip-flop 242. The output of PLC 320 and one of signals 232 are applied to clock control and asynchronous load control logic 324 to produce a signal applied to the clock input terminal of flip-flop 242. This signal controls the clocking of flip-flop 242, as well as the asynchronous loading of that flip-flop (e.g., when loading the starting value into a loadable counter).

The main data output 246 of universal logic block 240 is the other input to logic element 248. The output of element 248 is the D input to flip-flop 242 (for registered output from logic module 212). The output of element 248 can also bypass flip-flop 242 via programmable (i.e., FCE controlled) switch 330 (for unregistered output from the logic module). FCE 331 controls switch 330. Finally, the output of element 248 is also the cascade connect output 272 from this logic module to the next logic module 212 in the cascade connect chain.

Universal logic block 240 in FIG. 17 is equipped as shown in above-mentioned application Ser. No. 07/880,752 to provide as outputs X and Y the logical NOR and logical NAND of two inputs to block 240. As is also shown in said above-mentioned application, carry select logic 326 inverts X and Y, and then uses fast carry input 270 to select the appropriate one of the inverted signals as the fast carry output 270 to be applied to the next logic module 212 in the fast carry chain.

As mentioned above, FIG. 18 shows a typical tri-state driver 350 such as can be used for drivers 256 and 260 in FIG. 11. (Of course, any other suitable tri-state driver can be used instead if desired.) Data is applied to input terminal TRIIN, and a driver-enabling signal is applied to terminal RSELTRI (e.g., from a programmable RAM cell). If driver 350 is enabled by the latter signal, the input data is passed to output terminal TRIOUT. Driver 350 has three stages. The first stage includes P-channel transistors MP0 and MP1 and N-channel transistor MN0 connected in series between VCC (logical 1) and ground (logical 0). The TRIIN terminal is connected to the gates of MP0 and MN0. The inverted RSELTRI signal is applied to the gate of MP1. The second stage includes P-channel transistor MP2 and N-channel transistors MN1 and MN2 connected in series between VCC and ground. The RSELTRI signal is applied to the gates of MP2 and MN1. The signal between MP0 and MP1 is applied between MP2 and MN1, as well as to the gate of third stage P-channel transistor MP3. The signal between MP1 and MN0 is applied between MN1 and MN2, as well as to the gate of third stage N-channel transistor MN3. MP3 and MN3 are connected in series between VCC and ground. The node between MP3 and MN3 is TRIOUT.

Although the use of tri-state drivers is preferred for elements such as 256 and 260 in FIG. 11, in some embodiments of the invention it may be possible to employ simple buffers instead.

Figure 19:
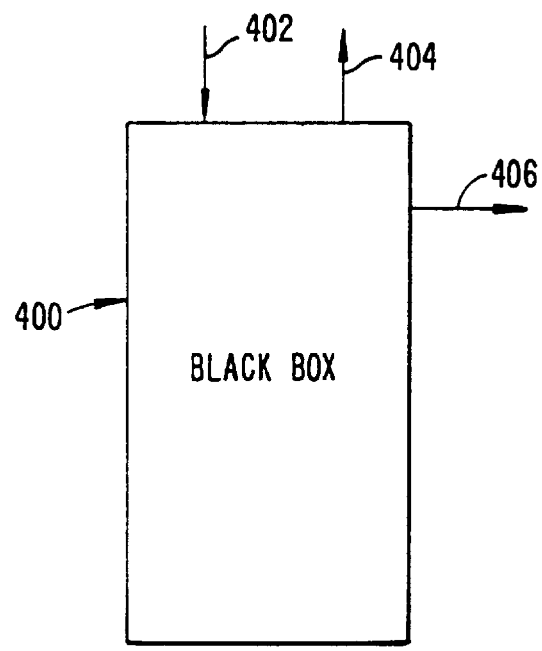
FIG. 19 illustrates a block diagram of typical logic array blocks used in the programmable logic device of the present invention.

Implementation of typical LABs used in the programmable logic device of the present invention is not limited to what has been discussed above with respect to LABs 14 and 214 of FIGS. 1 and 10, respectively. A typical LAB can be represented by a box 400 having inputs 402 and outputs 404 and 406, as shown in FIG. 19. Box 400 represents a logic circuit, such as those discussed above with respect to LABs 14 and 214, capable of performing one or more functions. Furthermore, the typical LAB is capable of being programmably connected to the global interconnect network of any programmable logic device, such as those described in the present invention. The global interconnect structure of the present invention has been described above with reference to FIGS. 2 and 11.

Figure 20:
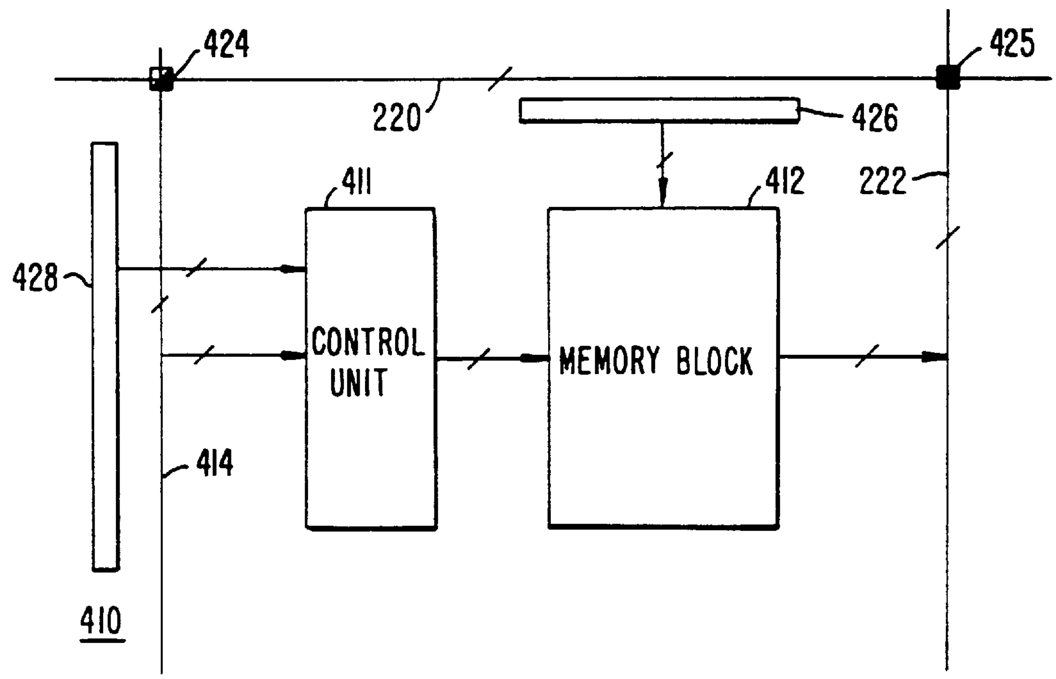
FIG. 20 illustrates a block diagram of a RAM-LAB according to the present invention.

FIG. 20 illustrates a block diagram of another implementation of a typical LAB depicted by box 400. FIG. 20 shows a RAM-LAB 410 which provides a user with a block of memory that can be utilized as Random Access Memory ("RAM") or Read Only Memory ("ROM"). RAM-LAB 410 includes a control unit 411 and a memory unit 412. Control unit 411 receives data and address information from the user and passes them to memory unit 412. Control unit 411 also generates the necessary control signals to control the transfer of data to and from memory unit 412. RAM-LAB 410 can be directly accessed by the user during user controlled operations, or it can be accessed by the programming software. The programming software, such as the ALTERA MAX™ programming software, is used to initialize and program a programmable logic device. The programming software is provided by the manufacturer of the programming logic device.

FIG. 20 also shows intra-LAB conductors 414, Global Horizontal ("GH") conductors 220, and Global Vertical ("GV") conductors 222, which are used by the designer to access RAM-LAB 410. Intra-LAB conductors 414 are programmably connected to control unit 411 and provide a path for inputting the user data, address, and control information to RAM-LAB 410. Intra-Lab conductors 414 are also programmably connected to GH conductors 220. This connection is shown by partially solid box 424, which indicates that only a selected number of GH conductors 220 can be connected to each intra-LAB conductor 414. The output of RAM-LAB 410 is programmably connected to GV conductors 222. GV conductors 222 are the same vertical global conductors as shown in FIG. 11, and are programmably connected to GH conductors 220 to provide for inter-LAB communications. The connection between GH conductors 220 and GV conductors 222 is shown by a solid box 425, which indicates that each GV conductor 222 is connected to at least one GH conductor 220.

Finally, FIG. 20 shows data programming register 426 and address programming register 428. These registers are used by the programming software during the FIFO programming of RAM-LAB 410. Data register 426 is used to send data to RAM-LAB 410 and address programming register 428 is used to send address information to RAM-LAB 410. Data and address programming registers 426 and 428 are shared by all RAM-LABs 410 in a typical row of RAM-LABs.

Figure 21A:
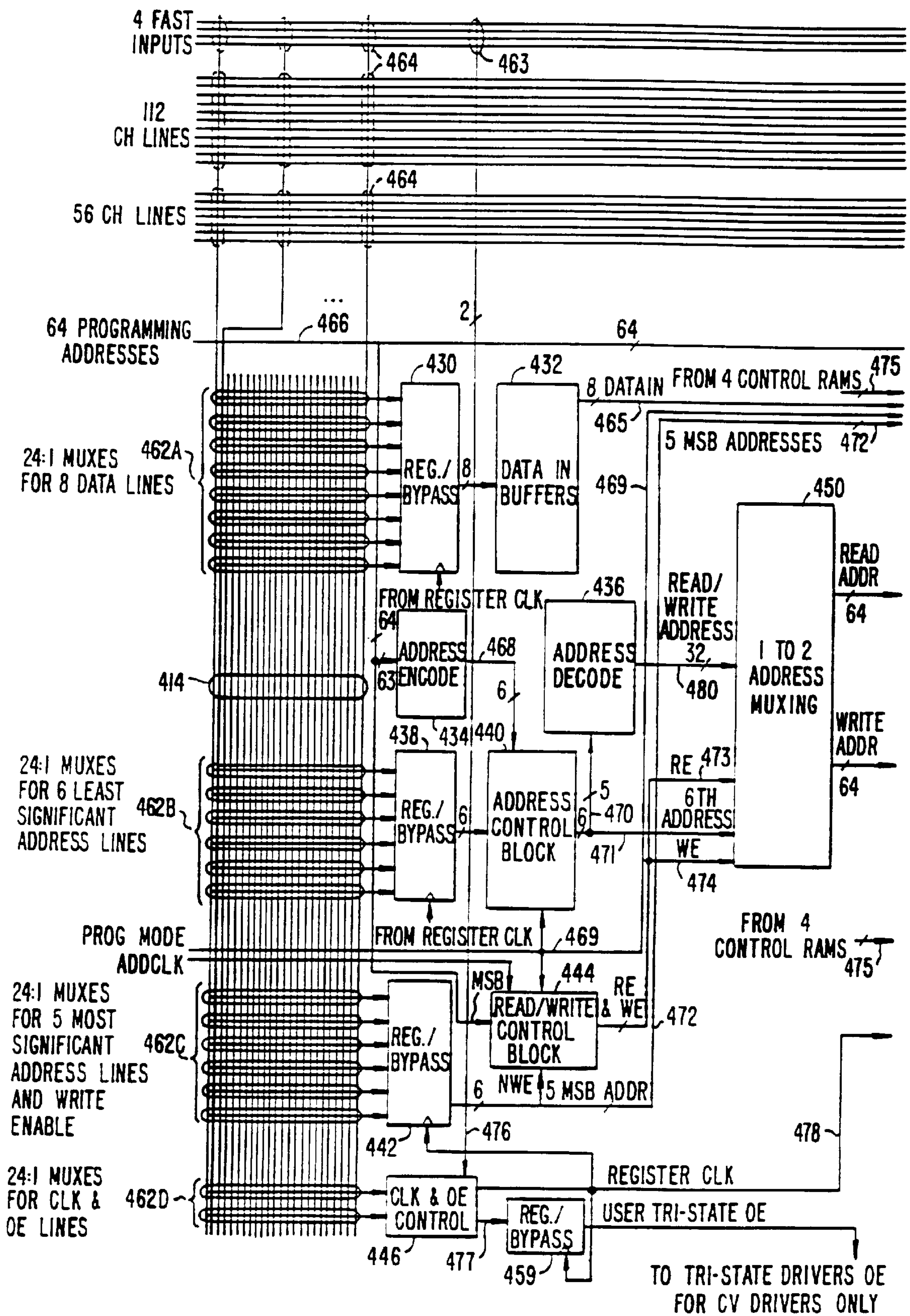
FIG. 21 illustrates a preferred embodiment of the RAM-LAB in FIG. 20.
Figure 21B:
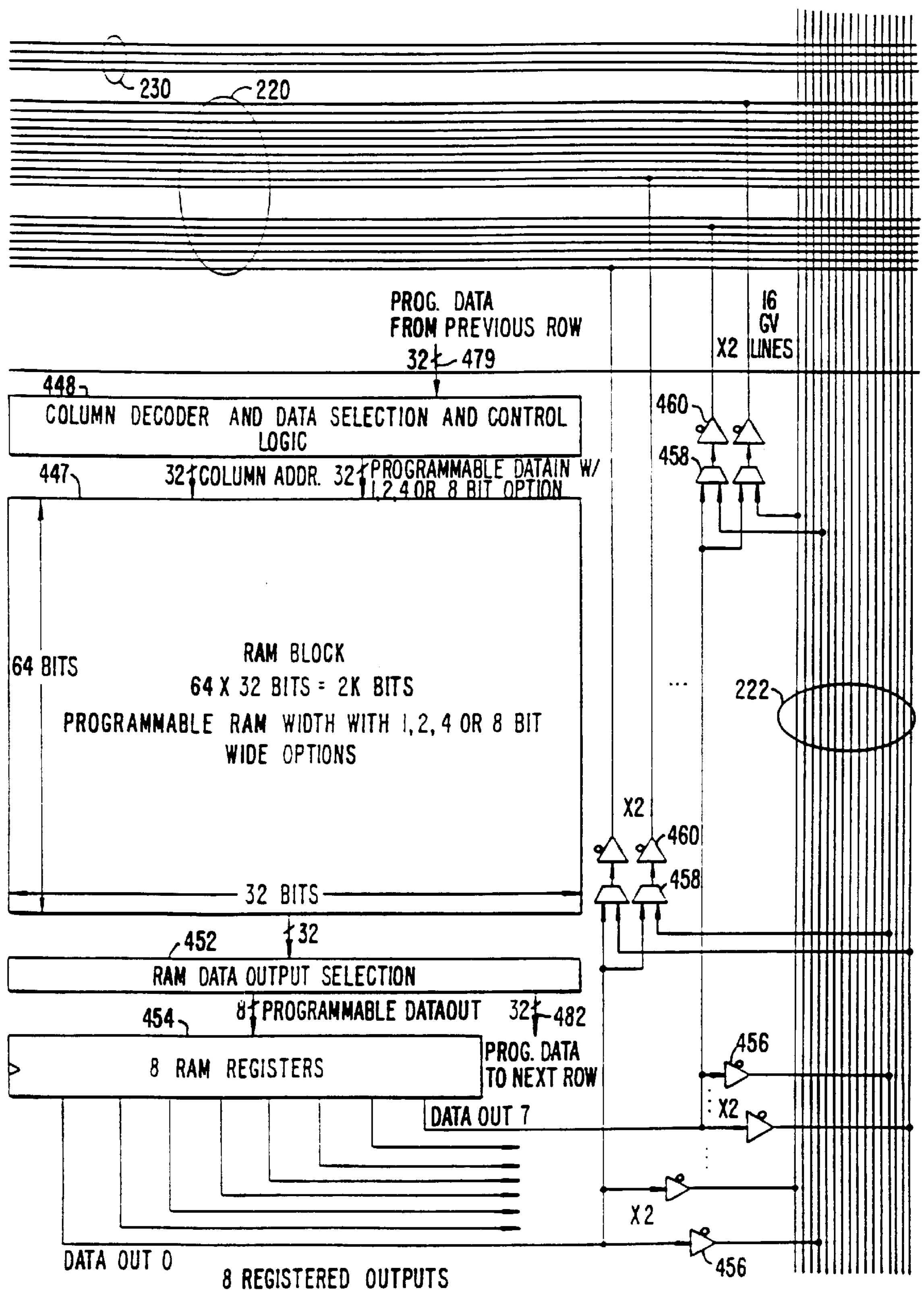

FIG. 21 illustrates a preferred embodiment of RAM-LAB 410 in FIG. 20. In this embodiment, registers 430, 438, and 442, data-in buffer 432, address encode 434, address decode 436, address control 440, read/write control 444, CLK/OE control 446, and register 459 form control unit 411 of FIG. 20. RAM block 447, interface blocks 448, 450 and 452, and RAM register 454 form memory unit 412 of FIG. 20. The RAM-LAB 410 of FIG. 21 can be accessed by the user or the programming software. The prog.mode control signal carried by signal line 469 (hereinafter prog.mode 469) determines whether RAM-LAB 410 is being accessed by the user or the programming software. Prog.mode 469 can be set by the user or by the programming software.

Each register 430, 438 and 442 includes latches (not shown), one 2 to 1 multiplexer corresponding to each latch (not shown), and a clock input which is connected to CLK signal 478. The clock input to each register is used to clock the data at the input of the latches. The input of the latches in registers 430, 438, and 442 are connected to intra-LAB conductors 414 via PLCs 462(*a*)462(*c*), respectively. The output of each latch in a particular register is connected to one of the two inputs of the corresponding 2 to 1 multiplexer. The other input of the above multiplexer is connected to the input of the respective corresponding latch. Therefore, if it is desired to operate registers 430, 438, and 442 as clock registers, the first input of each multiplexer is selected to be connected to its output. On the other hand, if it is desired to operate registers 430, 438, and 442 as bypass registers, the second input of each multiplexer is selected to be connected to its output. The output of the 2 to 1 multiplexers are the outputs of the registers. In the embodiment of FIG. 21, register 430 includes eight latches and eight 2 to 1 multiplexers, register 438 includes six latches and six 2 to 1 multiplexers, and register 438 includes six latches and six 2 to 1 multiplexers.

The user data is inputted in RAM-LAB 410 via register 430. Register 430 receives the eight-bit user data and provides them to the inputs of data-in buffer 432. Data-in buffer 432 includes electronic buffers (not shown) which allow it to receive and transfer the data information to top interface 448. The user address information is inputted in RAM-LAB 410 via register 438. Register 438 receives six bits of user address information and transfers them to address control 440. Address control 440 also receives another six bits of address information from address encode 434. Address encode 434 includes encoders (not shown) which encode the sixty four bits of FIFO addressing information it receives from address programming register 428 (in FIG. 20) via address lines 466 and generate six outputs. The encoded FIFO address information is passed to address control 440 via signal lines 468. Address control 440 includes multiplexers (not shown) which are controlled by prog.mode 469. Depending on the status of prog.mode 469, these multiplexers connect the user address information or the FIFO address information to the outputs of address control 440. Address control 440 generates six outputs, five of which are received by address decode 436. Address decode 436 includes decoders (not shown) which convert five bits of address information into thirty-two bits of address information. The generated address bits are sent to side interface 450 via signal lines 480. The sixth output of address control 440 is used as a control signal, the function of which will be described later.

The control information supplied by the user are inputted in RAM-LAB 410 via register 442. Register 442 receives six bits of information, which are denoted as the five most significant address bits and write enable in FIG. 21. The five most significant address bits are passed to top interface 448. Top interface 448 decodes these five bits and generates thirty-two address bits, the function of which will be described below. The sixth output of register 442 is connected to read/write control 444. Read/write control 444 also receives, as its input, the most significant address bits generated by the programming software during FIFO programming. Read/write control includes decoding logic circuits which are controlled by prog.mode 469, and a configuration bit (not shown). Depending on the status of prog.mode 469, the decoding logic circuits generate the read enable ("RE") 473 and write enable ("WE") 474 signals. After configuration, the default states for RE 473 and WE 474 are inactive and active, respectively. Depending on the status of RE 473 and WE 474, the address information at the inputs of side interface 450 is used to read from or write into RAM block 447.

As mentioned above, the clock inputs of registers 430, 438, and 442 are triggered by CLK signal 478. This signal is generated by CLK/OE control 446. CLK/OE control 446 includes multiplexers (not shown) and further generates an output enable ("OE") 477. OE 477 is latched in register 459 and is used to enable tri-state buffers 456. CLK/OE control 446 receives four inputs; two are received via PLCs 462(*d*) and the other two are received via PLC 463. PLC 463 programmably connects any two of universal fast conductors 230 to CLK/OE control 446. Inputs from universal fast conductors 230 enable the user to directly control the outputs of tri-state buffers 456. This is achieved by commanding CLK/OE control 446 to use the inputs received via PLC 463 to generate OE 477.

In the embodiment of FIG. 21, RAM block 447 is partitioned into thirty-two columns of memory, each of which provides 64×1 bits of memory (not shown). Each memory column can be independently addressed and used to form groups of one, two, four, and eight memory columns. The data to be written into RAM block 447 is presented to its data inputs by top interface 448. The address of each memory column is generated by top interface 448, whereas the address of each memory bit in a memory column is provided by side interface 450. The output of RAM block 447 is connected to GH conductors 220 and GV conductors 222 via bottom interface 452, RAM register 454, PLCs 458, and buffers 456 and 460.

Top, side, and bottom interfaces 448, 450, and 452, respectively, include multiplexers and decoders (not shown). As mentioned above, user data received by data-in buffer 432 is transferred to top interface 448. Top interface 448 also receives the FIFO data from data programming register 426 (FIG. 20) via data lines 479. Depending on the status of prog.mode 469, top interface 448 connects either of the two sets of data to its data outputs. Top interface 448 further includes nine control inputs, the first four of which are connected to control signals 475. The next control input is connected to prog.mode 469. The last five control inputs are connected to the five most significant address bits out of register 442, via signal lines 472. Top interface 448 also includes thirty-two column address outputs and thirty-two data outputs. The column address outputs are used to independently address each of the above-mentioned thirty-two columns of memory.

The above nine control bits control the operation of top interface 448. The five most significant address bits are decoded by top interface 448 to generate thirty-two column addresses, each of which addresses one memory column (not shown). The four control signals 475 are used to determine whether the memory columns in RAM block 447 are being grouped in groups of one, two, four or eight memory columns. For example, the information on these four lines can determine that RAM block 447 is being utilized as thirty-two separate columns of 64×1 memory. The last control inputs, i.e. prog.mode 469, determines whether the user generated data or the FIFO data is to be passed to the data outputs of top interface 448. During user operation, the eight-bit user data appears on eight of the thirty-two data outputs of top interface 448. The control RAMs in bottom interface 452 are used to determine which eight output terminals are connected to the user data.

As mentioned above, side interface 450 receives the thirty-two address bits generated by address decode 436. Side interface 450 includes de-multiplexers (not shown) which generate sixty-four address bits out of the received thirty-two address bits. These sixty-four address bits are shared by all thirty-two memory columns. Side interface register 450 also receives RE 473 and WE 474. These two signals are complementary and determine whether the address information at the output of side interface 450 is to be used to read from or write into RAM block 447.

During a read cycle, the output of each memory column is available at a respective input of bottom interface 452. For example, the output of the first memory column is connected to the first input of bottom interface 452, the output of the second memory column is connected to the second input of bottom interface 452, and etc. As mentioned above, the information on control signal lines 475 determines the mode in which the RAM block is being utilized. Thus, depending on the control information on lines 475, groups of one, two, four, or eight-bit information is provided at the data outputs of bottom interface 452. Bottom interface 452 also includes thirty-two FIFO outputs 482 which are used during the FIFO programming of RAM block 447. During the FIFO programming, the data received from data programming register 426 (FIG. 20) is passed to the next RAM-LAB 410 via FIFO outputs 482.

The information at the output of bottom interface 452 is provided to the inputs of RAM register 454. This information is latched in RAM register 454 using the register CLK signal 478. Once the information is latched in, it appears at the output of RAM register 454. This information can now be passed to other RAM-LABs 410 or the output terminals via GH and GV conductors 220 and 222. Each output of RAM register 454 is connected to two GV conductors 222 via two tri-state buffers 456. As mentioned above, the output of each tri-state buffer is controlled by the output of register 459.

The outputs of RAM register 454 are also programmably connected to GH conductor 220 via PLC 458 and tri-state buffer 460. In the embodiment of FIG. 21, each output of RAM register 454 is connected to two GH conductors 220. Each PLC 458 has two inputs, one of which is connected to one output of RAM register 454 and the second one is connected to GV conductor 222. In the embodiment of FIG. 21, there are sixteen PLCs 458 and sixteen tri-state buffers 460.

In addition, FIG. 21 shows portions of representative GH conductors 220, GV conductors 222, intra-LAB conductors 414, and universal fast conductors 230. Each of intra-LAB conductors 414 can be connected to a selected one (or more)

of conductors 220 and 230 via a PLC 464 (only some of which are shown in FIG. 21). As explained above with respect to PLCs 250, PLCs 464 can be implemented in any of a wide variety of ways. For example, each can be a relatively simple programmable connector such as a plurality of switches for connecting any one of several inputs to an output. Alternatively, each can be a somewhat more complex element which is capable of performing logic (e.g., by logically combining several of its inputs) as well as making a connection. In the latter case, for example, each PLC 464 can be a product term logic implementing function such as AND, NAND, OR, or NOR. PLCs 458, 462, and 463 can be implemented similar to PLCs 464. As described above, with reference to FIGS. 14–15B, global conductors 220 are connected to the input/output pads 290–298 (FIG. 14). Accordingly, the output of each RAM-LAB 410 can be provided to outside via input/output pads 290–298 as shown in FIGS. 15A and 15B.

Examples of components suitable for implementing PLCs 458 and 462–464 are EPROMs, EEPROMs, pass transistors, transmission gates, antifuses, laser fuses, metal optional links, etc. The components of PLCs 458 and 462–464 can be controlled by various function control elements ("FCEs") as described in more detail below (although with certain PLC implementations (e.g., fuses and metal optional links) separate FCE devices are not required, so that in those cases the depiction of FCE devices in the accompanying drawings merely indicates that the PLCs are programmable). In the embodiment of FIG. 21, each PLC 458, 462–464 is controlled by an FCE, not shown in FIG. 21, to connect one of its inputs to its output.

As explained before with respect to FCEs 251, FCEs controlling PLCs 458 and 462–464 (not shown) can also be implemented in any of several different ways. For example, they can be SRAMs, DRAMs, first-in first-out ("FIFO") memories, EPROMs, EEPROMS, function control registers (e.g., as in U.S. Pat. No. 3,473,160 to Wahlstrom), ferro-electric memories, fuses, antifuses, or the like.

Figures 22A, 22B:
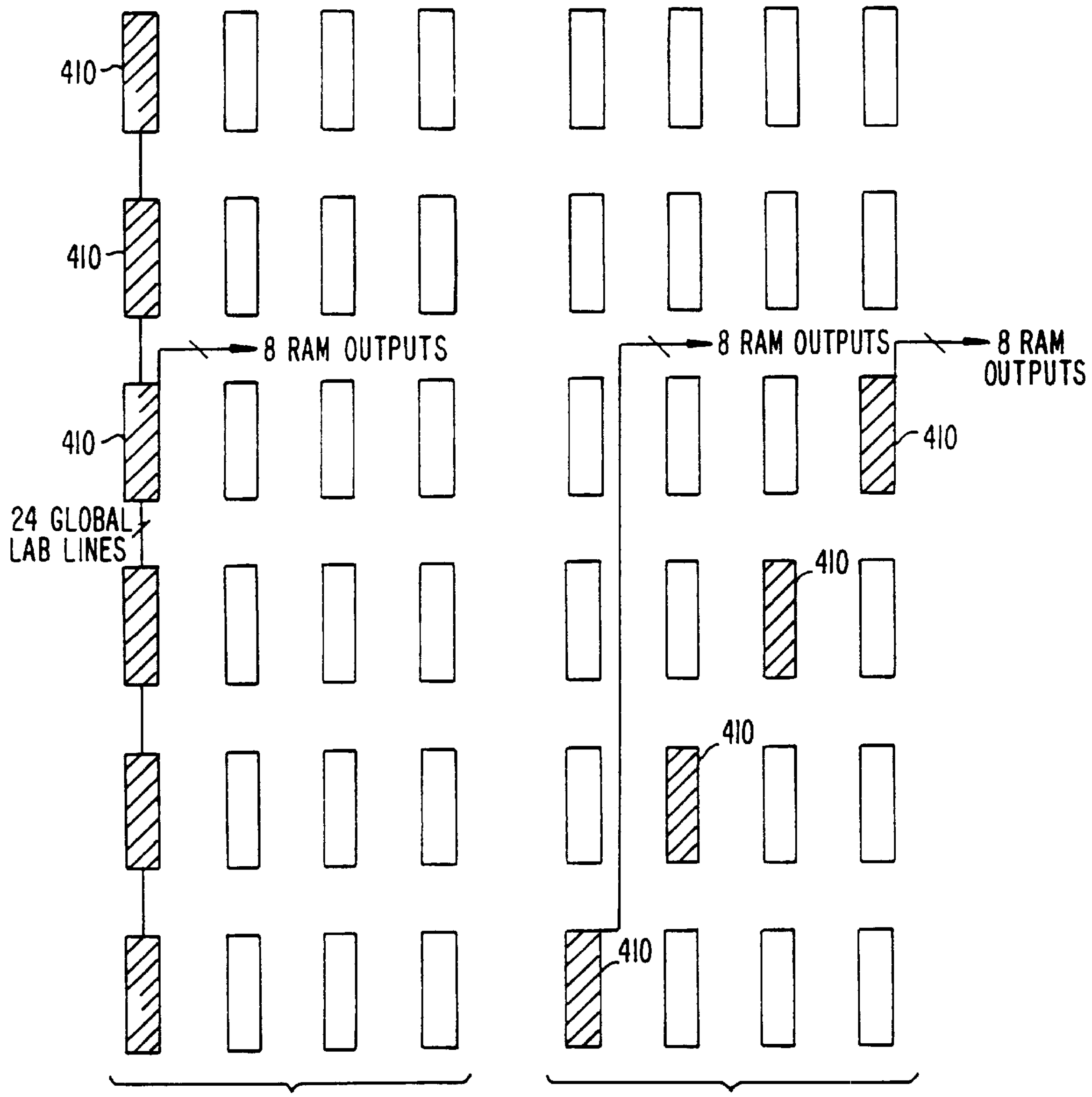
FIGS. 22A and 22B illustrate two alternatives of stacking the RAM-LABs of FIG. 21 to build memory blocks.

The memory capacity of RAM-LABs 410 of FIG. 20 can be utilized to create larger memory blocks by grouping more than one RAM-LAB as shown in FIGS. 22A and 22B. FIGS. 22A and 22B illustrate alternative methods of creating larger memory blocks. FIG. 22A illustrates the preferred method of creating a large memory block, in which RAM-LABs 410 are stacked in a column. This method allows for cascading RAM-LABs to generate deep and wide memory blocks, such as those shown in FIGS. 23A and 23B. FIG. 22B illustrates another method of constructing a block of memory, in which RAM-LABs 410 are staggered in different columns. The memory block of FIG. 22A is easier to access since all RAM-LABs are stacked in one column. Having all RAM-LABs in one column allows for accessing RAM-LAB 410 using the GV conductors parallel to the column; whereas, in the memory of FIG. 22B, a combination of GV and GH conductors parallel to different columns and rows must be utilized to access the individual RAM-LABs 410.

Figure 23A:
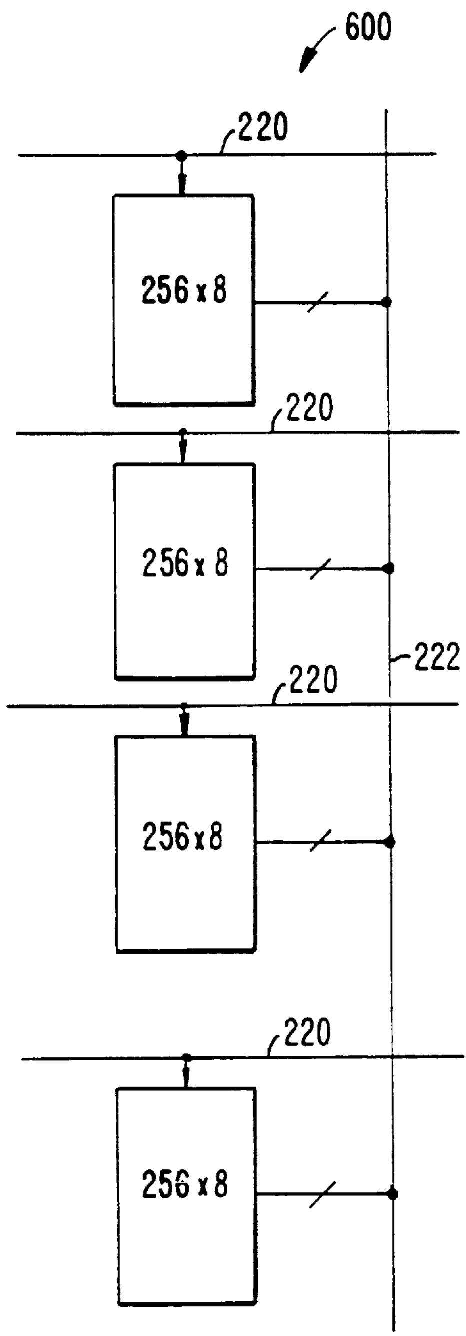
FIGS. 23A and 23B illustrate examples of constructing a deep memory block and a wide memory block, respectively, using the RAM-LABs of FIG. 21.

FIG. 23A shows a typical example of a wide memory block 600 using RAM-LABs 410 of FIG. 21 which are stacked as shown in FIG. 22A. The output of wide memory block 600 includes the outputs of each RAM-LAB 410. For example, if each RAM-LAB 410 generates eight output bits and four RAM-LABs 410 are used to build memory 600, memory 600 has thirty-two output bits. In the example of FIG. 23A, each RAM-LAB 410 provides 256×8 bits of memory, resulting in a total of 256×32 bits of memory in memory 600. To access a location in memory block 600, the address of that location is placed on GH conductors 220. This address information is provided to all RAM-LABs 410. Each RAM-LAB 410 places eight bits of data which represents the data stored in the addressed location of that particular RAM-LAB 410. Depending on the configuration of the memory block, the output of the first RAM-LAB 410 can be the eight least or most significant bits of the output of memory 600. Similarly, the output of the next RAM-LAB 410 can be the next eight least or most significate bits of the output of memory 600.

Figure 23B:
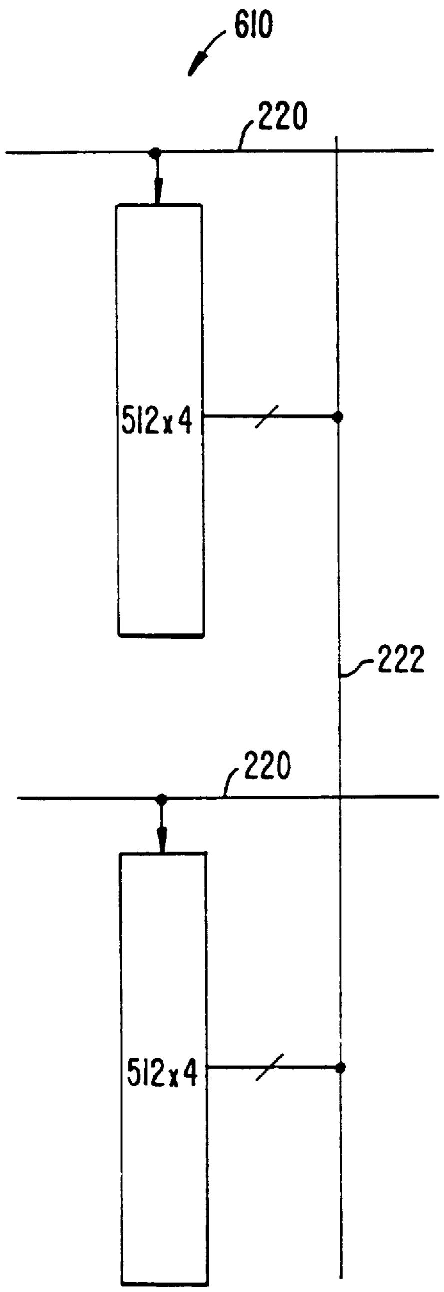

FIG. 23B illustrates an example of a typical deep memory block 610 using RAM-LAB 410 of FIG. 21. As mentioned before, RAM block 447 of each RAM-LAB 410 is partitioned into thirty-two columns of 64×1 memory. These columns of memory can be grouped together to construct a 256×8, 512×4, 1024×2, and 2048×1 memory. For example, to construct a 512×4 memory, the user sets control lines 475 to indicate a mode of operation in which RAM block 447 is partitioned into eight groups of memory, with each group having a distinct address. Each group has four columns of 64×1 memory and provides a total of 64×4 bits of memory. This scheme effectively creates a 512×4 memory block which includes eight smaller blocks of 64×4 memory bits. To address each smaller block, the information on signal lines 472 are set such that when decoded, they address one block at a time. For example, if the user wants to access a memory location in the third group, the address information on lines 472 must be set to select the third group. Once the third group is selected, the sixty-four address bits generated by side interface 450 can be used to access the memory location addressed by the address bits in the memory group.

Once the user configures RAM block 447 to achieve a memory block with a desired depth, RAM-LABs 410 can be stacked as explained with respect to wide memory 600 of FIG. 23A to achieve the desired memory width. For example, in FIG. 23B two 512×4 bits of memory are used to construct a 512×8 bit memory.

Figure 24A:
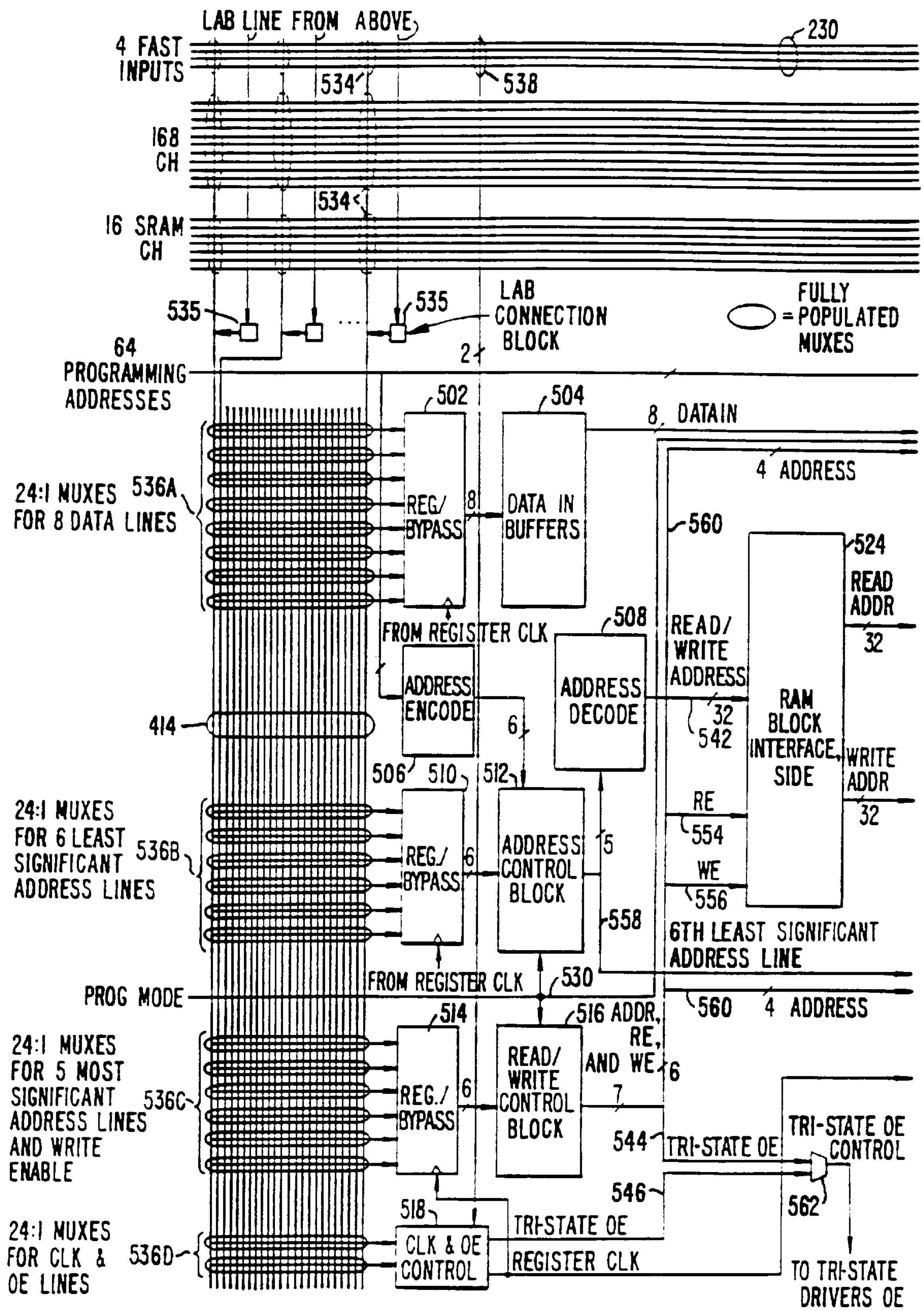
FIG. 24 is a second embodiment of the RAM-LAB in FIG. 20.
Figure 24B:
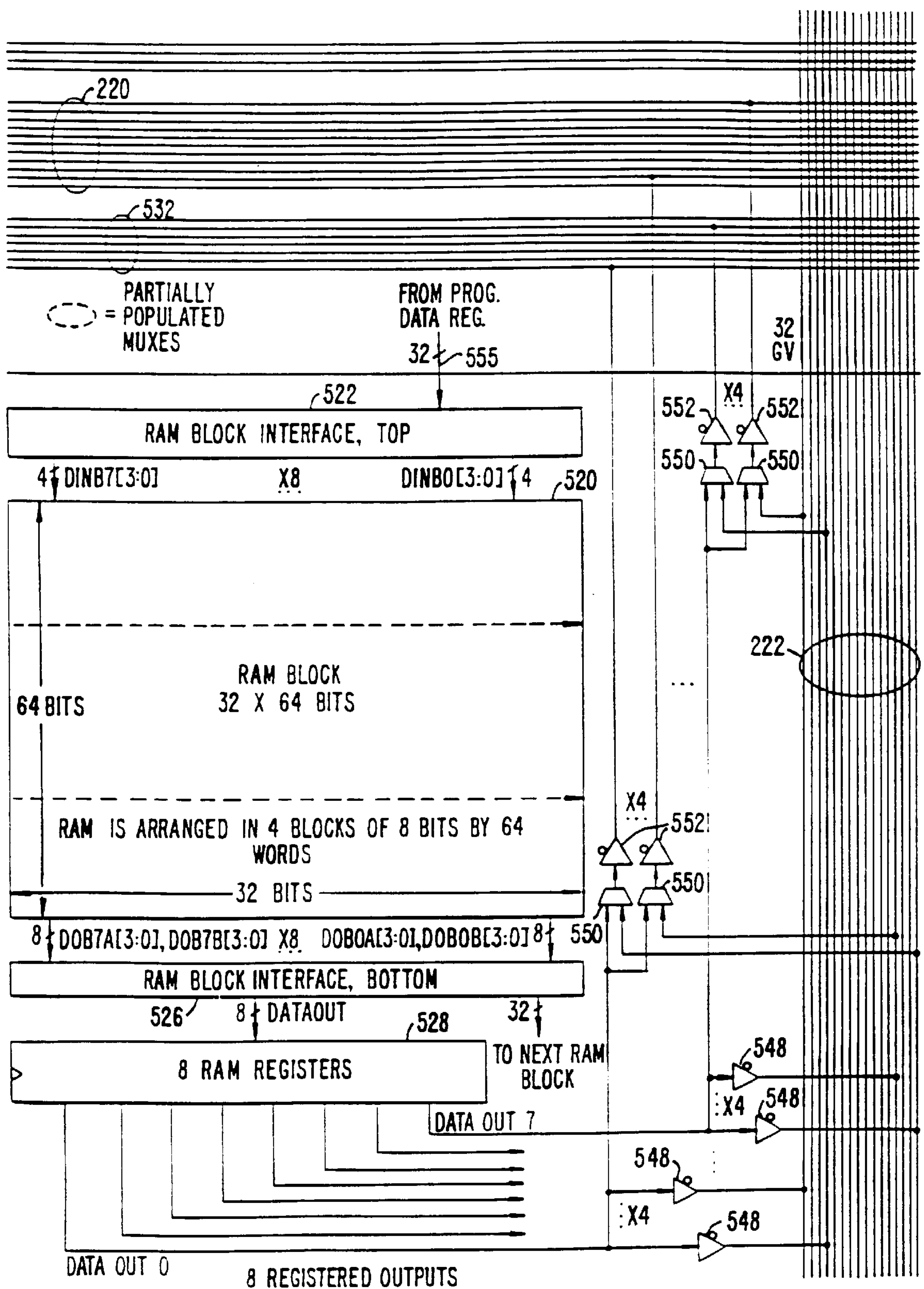

FIG. 24 illustrates a second embodiment of RAM-LAB 410 in FIG. 20. In this embodiment, registers 502, 510, 514, data-in buffer 504, address encode 506, address decode 508, address control 512, read/write control 516, and CLK/OE control 518 form control unit 411 of FIG. 20. RAM block 520, interface circuits 522–526 and RAM register 528 form memory unit 412 of FIG. 20. Similar to RAM-LAB 410 of FIG. 21, RAM-LAB 410 of FIG. 24 is also capable of being accessed by the user or the programming software. The prog.mode signal present on signal line 530 (hereinafter prog.mode 530) determines whether RAM-LAB 410 is being used by the user or the programming software. The prog.mode 530 control signal can be set by the user or the programming software.

In the embodiment of FIG. 24, the user information is provided to RAM-LAB 410 via GH conductors 220, SRAM GH conductors 532, universal fast conductors 230, intra-LAB conductors 414, and PLCs 534–538. The outputs of PLCs 536*a*, 536*b*, 536*c*, and 536*d* are connected to the inputs of registers 502, 510, 514, and CLK/OE control 518, respectively. Each register 502, 510, and 514 includes latches (not shown), one 2 to 1 multiplexer corresponding to each latch (not shown), and a clock input which is connected to CLK signal 540. The clock input to each register is used to clock the data at the input of the latches. The input of the latches in registers 502, 510 and 514 are connected to the outputs of PLCs 536(*a*)–536(*c*), respectively. The output of each latch in a particular register is connected to one of the two inputs of the corresponding 2 to 1 multiplexer. The other input of the above multiplexer is connected to the input of the respective corresponding latch. Therefore, if it is desired to operate registers 502, 510 and 514 as clock registers, the first input of each multiplexer is selected to be connected to its output. On the other hand, if it is desired to operate registers 502, 510, and 514 as bypass registers, the second input of each multiplexer is selected to be connected to its output. The output of the 2 to 1 multiplexers are the outputs of the registers. In the embodiment of FIG. 24, register 502 includes eight latches and eight 2 to 1 multiplexers, register 510 includes six latches and six 2 to 1 multiplexers, and register 514 includes six latches and six 2 to 1 multiplexers.

The user data information is transferred to the data-in-buffer 504 via register 502. Data-in buffer 504 includes electronic buffers (not shown) which allow it to receive and transfer the data information to top interface 522. The user address information is inputted in RAM-LAB 410 via register 510. Register 510 transfers the received user data information to address control 512. Address control 512 also receives six inputs from address encode 506. Address encode 506 includes encoders which encode the sixty-four bits of FIFO addressing information it receives from address programming register 428 (in FIG. 20) via address lines 566 and generate six outputs. Address control 512 includes multiplexers (not shown) which are controlled by prog.mode 469. Depending on the status of the prog.mode 530, these multiplexers connect the user address information or the FIFO address information the outputs of address control 512. Address control 512 generates six outputs, five of which are received by address decode 508. Address decode 508 includes decoders (not shown) which connect the five bits of address information into thirty-two bits of address information. These address bits are sent to side interface 524 via address lines 542. The sixth output of address control 512 is used as a control signal, the function of which will be disclosed below.

Other control information which determine the operation of RAM-LAB 410 of FIG. 24 are generated by read/write control 516. Read/write control 516 receives the user supplied control information via register 514. Read/write control 516 includes decoding logic circuits and receives six inputs and generates seven outputs. Four of the seven outputs are used by top interface 522, the next two are used by side interface 524, and the last signal is used as an output enable signal 544. The operation of the above seven signals will be described below. Read/write control 516 also includes an identity bit (not shown) which is used to identify each RAM-LAB 410. This identity bit is utilized when RAM-LABs are grouped to construct deep memory blocks. A detailed approach to constructing deep memory blocks and the function of the identity bit will be disclosed with respect to FIG. 25A.

As mentioned above, the clock inputs of registers 502, 506 and 514 are triggered by Register CLK signal 540. This signal is generated by CLK/OE control 518. CLK/OE control 518 includes multiplexers and further generates a tri-state output enable ("OE") 546 which is used as one of the two output enable signals that control the outputs of tri-state buffers 548. CLK/OE control 518 includes four inputs. The first two inputs are connected to any two intra-LAB conductors 414 via PLCs 536D, and the next two inputs are connected to any two universal fast conductors 230 via PLC 538. Accessing CLK/OE control 518 via universal fast conductors 230 enables the user to directly control the outputs of tri-state buffers 548. This is achieved by commanding CLK/OE control 518 to use the inputs received via PLC 438 to generate OE 546.

In the embodiment of FIG. 24, RAM block 520 is divided into four memory columns (not shown). Each memory column has sixty-four address inputs, eight data inputs, and sixteen data outputs. Each memory column is divided into a top portion and a bottom portion (not shown). Each of the top and bottom portions of each memory column is assigned eight data outputs of the respective memory column. The data inputs of the memory column are shared by the top and bottom portions. Furthermore, each portion is addressed by thirty-two address bits. The data and address information are provided to the RAM block 520 through top and side interfaces 522 and 524 by the user or the programming software. The outputs of RAM block 520 are provided to GH and GV conductors 220 and 222 via bottom interface 526, RAM register 528, PLCs 550, and tri-state buffers 548 and 552.

Top, side, and bottom interfaces 522, 524, and 526, respectively, include multiplexers and decoders (not shown). As mentioned above, user data received by data-in buffer 504 is transferred to top interface 522. Top interface 522 also receives thirty-two bits of FIFO data information from data programming register 426 (FIG. 20) via data lines 555. The FIFO data information is partitioned into four bytes of data, with each byte of data to be written in one memory column. Depending on the status of prog.mode 530, top interface 522 provides either of the two sets of data to its outputs. During the FIFO all received data information are provided to the data inputs of the RAM block 520. During user programming, four control signals 560 determine which memory column is to receive the user data information. Top interface 522 further includes thirty-two outputs which are grouped in four groups of eight bits. The outputs of top interface 548 are denoted by DINB0(x)–DINB7(x). "X" ranges from 0 to 3 and denotes the corresponding group of eight-bit outputs. For example, DINB0(1) to DINB7(1) refer to the second group of eight-bit outputs.

As mentioned earlier, the thirty-two bits of address information generated by address decode 508 are sent to side interface 524. Side interface 524 provides these thirty-two address bits to the upper and lower portions of each memory column. Side interface 524 further receives two control signals from read/write control 516. These control signals are read enable ("RE") 554 and write enable ("WE") 556. These two signals hold complementary logic levels and determine whether the address information at the output of side register 450 is to be used to read from or write into RAM block 520. Another control signal received by side interface 522 is the sixth output of address control 412, i.e., control signal 558. Control signal 558 determines whether the upper or lower portion of each memory column is to be addressed by the address information.

During a read cycle, the outputs of each memory column are available to the inputs of bottom interface 526. In FIG. 24, the outputs of the memory columns are denoted by DOB0A(3:0) through DOB7A(3:0) and DOB0B(3:0) through DOB7B(3:0). "DB0–DB7" refer to the eight outputs of each memory column. The letter "A" refers to the upper portion, and the letter "B" refers to the lower portion of each memory column. The content of the parenthesis indicates which memory column has been selected. For example, DOB0A(0) is the first output of the upper portion of the first memory column and DOB5B(2) is the sixth output of the lower portion of the third memory column. Bottom interface 526 receives eight groups of eight-bit data information. Each group represents the output of one half of a memory column. Bottom interface 526 further receives control lines 558 and 560. Control signals 560 determine the output of which memory column is to be presented to the inputs of RAM register 528, and control line 558 determines whether the output of the top or bottom portion of the selected memory column is to be outputted.

The information at the output of bottom interface 526 is provided to the inputs of RAM register 528. The data at the inputs of RAM register 528 is latched using the Register CLK signal 540. RAM register includes eight outputs which are connected to GV conductors 222 via tri-state buffers 548. Each output of RAM register 528 is connected to four individual GV conductors 222. The output of each tri-state buffer is controlled by the output of PLC 562.

In the embodiment of FIG. 24, PLC 562 receives two input signals and connects one of the two signals to its output, The inputs of PLC 562 are connected to two tri-state buffer enable singals 544 and 546. As mentioned earlier, tri-state OE 544 is generated by read/write control 516 and tri-state OE 546 is generated by CLK/OE control 518. Tri-state OE 546 is selected when the user desires to directly control tri-state buffers 548; otherwise, tri-state OE 544 is always selected to control the output of each tri-state buffer 548.

Outputs of RAM register 528 can also be programmably connected to GH conductors 220 and SRAM GH conductors 532 via PLCs 550 and tri-state buffers 552. Each PLC 550 has two inputs, one of which is connected to one output of RAM register 528 and the other is connected to one GV conductor 222. Each output of RAM register 528 is connected to the input of four PLCs 550; whereas, each of the GV conductors 222 is connected to the input of one PLC 550. The output of each PLC 550 is connected to one GH or SRAM GH conductors 220 or 532, respectively, via a tri-state buffer 552. In the embodiment of FIG. 24, there are thirty-two PLCs 550 and thirty-two tri-state buffers 552.

In addition, FIG. 24 shows portions of representative GH conductors 220, GV conductors 222, intra-LAB conductors 414, universal fast conductors 230, SRAM conductors 532 and LAB connection blocks 535. Each intra-LAB conductors 414 can be connected to a selected one (or more) of conductors 220, 230 and 532 via a PLC 534 (only some of which are shown in FIG. 24). Similar to the embodiment of FIG. 21, the global conductors in the embodiment of FIG. 24 are connected to the input/output pads 290–298 as shown in FIGS. 15A and 15B.

As explained above with respect to PLCs 464, PLCs 534–536 can be implemented in any one of a wide variety of ways. In the depicted embodiment, each PLC 534–536 and 550 is controlled by an FCE (not shown in FIG. 24) to connect one of its inputs to its output. Each of the inputs is the signal on a predetermined respective one of conductors 220, 230 and 532. Furthermore, FCEs 251 can also be implemented in any of several different ways, as explained above. For example, they can be SRAMs, DRAMs, first-in first-out ("FIFO") memories, EPROMs, EEPROMS, function control registers (e.g., as in U.S. Pat. No. 3,473,160 to Wahlstrom), ferro-electric memories, fuses, antifuses, or the like.

Figures 25A, 25B:
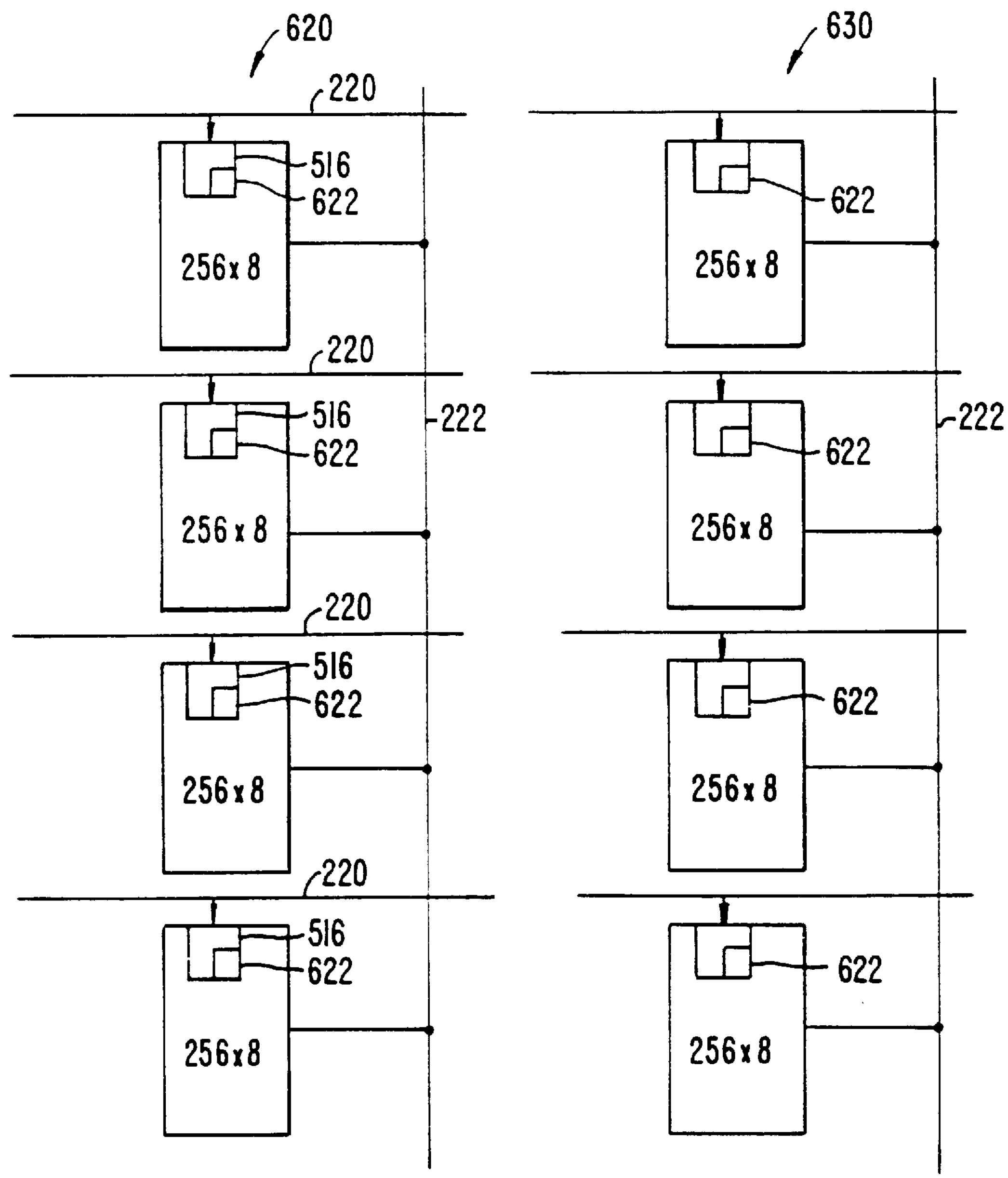
FIGS. 25A and 25B illustrate examples of constructing a deep memory block and a wide memory block, respectively, using the RAM-LABs of FIG. 24.

Similar to RAM-LAB 410 of FIG. 21, RAM-LAB 410 of FIG. 24 can also be utilized to build larger memories. FIG. 25A shows an example of a deep memory 620 using RAM-LABs 410 of FIG. 24. Each RAM-LAB 410 provides an 256×8 bits of memory. To address a memory location in memory 620, the address is placed on GH conductors 220. This address information is presented to all RAM-LABs 410 in memory 620; however, only one RAM-LAB must respond to this address information. Previously, we briefly mentioned that read/write control 516 of each RAM-LAB 410 includes an identity bit. Identity bits 622 are used to determine which RAM-LAB 410 is to respond to the addressing information. In memory 620 each identity bit 622 is programmed with different information. Therefore, to select a particular RAM-LAB 410, the control information provided by the user or the programming software must include a control bit which matches the information in identity bit 122 of one RAM-LAB 410. Read/write control 516 of each RAM-LAB 410 compares this control bit with the information stored in its identity bit 622. If there is a match, read/write control 516 of the selected RAM-LAB 410 generates OE 544 to control the output of tri-state buffers 548. This effectively results in control of GV conductors 222 by the selected RAM-LAB 410. Furthermore, read/write control 516 generates the necessary control signals to facilitate accessing RAM block 520. The example of FIG. 25A shows memory 620 with a capacity of (M)(256)×8 bits, where M represents the number of RAM-LABs 410 in the column.

FIG. 25B illustrates an example of a wide memory block 630 using RAM-LAB 410 of FIG. 24. In memory 630, the information stored in each identity bit 622 is identical. Therefore, when addressed, all RAM-LAB 410 respond simultaneously by placing their outputs on GV conductors 222. Accordingly, with each RAM-LAB 410 having eight outputs and with global conductors 222 having thirty two lines, there is a possibility of building a wide memory block with the capacity of 256×32 bits of memory.

It will be understood that the foregoing is merely illustrative of the principles of this invention, and that various modifications can be made by those skilled in the art without departing from the scope and spirit of the invention. For example, the number of logic elements in each LAB can be altered if desired. Similarly, the number of LABs can be varied, as can the numbers of the various types of conductors and inter-conductor connections. Also, the number of look-up table inputs is arbitrary and can be made more or less than four if desired. Another example of modifications with the scope of this invention, any of the techniques shown in FIGS. 5–9 can be used to facilitate providing conductor interconnections of the type indicated, for example, at 231, 249, and 253 in FIG. 11 herein. As still another example of modifications with the scope of this invention, RAM blocks 447 and 520, in FIGS. 21 and 24, respectively, can be replaced by function blocks, such as Arithmetic Logic Units ("ALUs"), multipliers, register files, high speed adders, etc., to provide function specific LAB units.

What is claimed is:

1. A programmable logic device organized in a two-dimensional array comprising:

a first plurality of conductors, each of said first plurality of conductors provided in a first dimension of said two-dimensional array;

a second plurality of conductors, each of said second plurality of conductors provided in a second dimension of said two-dimensional array;

a plurality of logic blocks devoted substantially to logic functions, each of said logic blocks programmably coupled to at least one of said first or second plurality of conductors; and a plurality of memory blocks devoted substantially to user memory, each of said memory blocks programmably coupled to at least one of said first or second plurality of conductors, wherein at least one of said memory blocks is selectively organized in a variable memory configuration.

2. The programmable logic device of claim 1 wherein said at least one of said memory blocks further comprises 2048 bits of memory.

3. The programmable logic device of claim 2 wherein said at least one of said memory blocks is organized in a 2048×1 memory configuration.

4. The programmable logic device of claim 2 wherein said at least one of said memory blocks is organized in a 1024×2 memory configuration.

5. The programmable logic device of claim 2 wherein said at least one of said memory blocks is organized in a 512×4 memory configuration.

6. The programmable logic device of claim 2 wherein said at least one of said memory blocks is organized in a 256×8 memory configuration.

7. The programmable logic device of claim 2 wherein said at least one of said memory blocks is organized in a 128×16 memory configuration.

8. The programmable logic device of claim 1 wherein each of said memory blocks further comprises:

a plurality of memory columns; and a control unit coupling said first plurality of conductors to said plurality of memory columns.

9. The programmable logic device of claim 8 wherein each of said memory blocks further comprises:

a data input register coupled to said memory columns; and an address register coupled to said control unit.

10. The programmable logic device of claim 7 wherein each of said memory blocks further comprises a data output register coupled to said memory columns.

11. The programmable logic device of claim 10 wherein said data output register is programmably coupled to said second plurality of conductors.

12. The programmable logic device of claim 7 wherein said control unit further comprises:

an address encoder coupled to said address register;

an address control circuit having inputs coupled to said address encoder and to said plurality of first plurality of conductors; and an address decoder having inputs coupled to said address control circuit.

13. The programmable logic device of claim 9 wherein said control unit further comprises a read/write control circuit having a plurality of inputs and a plurality of outputs coupled to said memory columns.

14. The programmable logic device of claim 13 wherein said plurality of inputs to said read/write control circuit further comprise:

a program mode signal from said address register;

an address clock; and a write enable signal.

15. The programmable logic device of claim 10 wherein said control unit further comprises a clock/output enable generator having a plurality of inputs coupled to said first plurality of conductors and an output coupled to said data output register.

* * * * *